US012578236B2

(12) United States Patent
Vercesi et al.

(10) Patent No.: US 12,578,236 B2
(45) Date of Patent: Mar. 17, 2026

(54) EMBEDDED MECHANICAL STOPPER FOR THERMAL SENSOR DEVICE

(71) Applicant: STMicroelectronics International N.V., Geneva (CH)

(72) Inventors: Federico Vercesi, Milan (IT); Silvia Nicoli, Briosco (IT); Cinzia De Marco, Gorgonzola (IT)

(73) Assignee: STMicroelectronics International N.V., Geneva (CH)

( * ) Notice: Subject to any disclaimer, the term of this patent is extended or adjusted under 35 U.S.C. 154(b) by 465 days.

(21) Appl. No.: 18/182,058

(22) Filed: Mar. 10, 2023

(65) Prior Publication Data

US 2024/0302219 A1    Sep. 12, 2024

(51) Int. Cl.
| | |
|---|---|
| H01L 23/485 | (2006.01) |
| G01J 5/02 | (2022.01) |
| G01K 7/01 | (2006.01) |
| H01L 23/522 | (2006.01) |
| H10F 39/00 | (2025.01) |
| *H10D 86/00* | (2025.01) |

(52) U.S. Cl.
CPC .............. G01K 7/015 (2013.01); G01J 5/024 (2013.01); H01L 23/485 (2013.01); H01L 23/5226 (2013.01); H10F 39/011 (2025.01); *H10D 86/201* (2025.01)

(58) Field of Classification Search
CPC ... G01K 7/015; H01L 23/485; H01L 23/5226; G01J 5/02; G01J 5/0225; G01J 5/0235;

G01J 5/10; G01J 5/12; G01J 5/023; G01J 5/024; G01J 5/20; H10F 39/011; H10F 39/193; H10D 86/201
See application file for complete search history.

(56) References Cited

U.S. PATENT DOCUMENTS

| | | | |
|---|---|---|---|
| 7,202,101 B2 | 4/2007 | Gabriel et al. | |
| 7,531,800 B2 | 5/2009 | Ohta et al. | |
| 8,941,064 B2 | 1/2015 | Akin et al. | |
| 11,486,782 B2 | 11/2022 | Heuck et al. | |
| 2009/0101622 A1 | 4/2009 | Wang et al. | |
| 2010/0295138 A1 | 11/2010 | Silverstre et al. | |

FOREIGN PATENT DOCUMENTS

JP    2007187495 A  *  7/2007  ................ G01J 5/02

OTHER PUBLICATIONS

English Abstract of JP 2007-187495 (Year: 2025).*
(Continued)

*Primary Examiner* — Randy W Gibson
(74) *Attorney, Agent, or Firm* — Crowe & Dunlevy LLC

(57) ABSTRACT

Disclosed herein are thermal sensor devices including TMOS devices with a mass suspended over a cavity by springs extending between a frame and the mass. The thermal sensor devices include stoppers that limit upward and/or downward movement of the springs and therefore the mass. These stoppers are formed from sidewalls supporting a top cap over the frame, springs, and mass. The stoppers are constructed by using various overlapping metal layers during fabrication. Details of forming the stoppers using these overlapping metal layers are contained here.

16 Claims, 29 Drawing Sheets

100

(56)         References Cited

OTHER PUBLICATIONS

Moisello, Elisabetta, et al.: "Thermal Sensors for Contactless Temperature Measurements, Occupancy Detection, and Automatic Operation of Appliances During the COVID-19 Pandemic: A Review," Micromachines 2021, 12, 148, 19 pgs.

EP Search Report and Written Opinion for counterpart EP Appl. No. 24159086.8, report dated Jul. 30, 2024, 8 pgs.

Avraham, Moshe, et al.: "Wafer-Level Packaged CMOS-SOI-MEMS Thermal Sensor at Wide Pressure Range for IoT Applications," Engineering Proceedings, 2020, 2, 30; doi:10.3390/ecsa-7-08191, 7 pgs.

Michalik, Piotr, et al.: "Experiments on MEMS Integration in 0.25 μm CMOS Process," Sensors, 2018, 18, 2111; doi:10.3390/s18072111, 22 pgs.

Qu, Hongwei: "CMOS MEMS Fabrication Technologies and Devices," Micromachines 2016, 7, 14; doi:10.3390/mi7010014, 21 pgs.

\* cited by examiner

EMBEDDED MECHANICAL STOPPER FOR THERMAL SENSOR DEVICE

TECHNICAL FIELD

This disclosure is directed to the field of thermal sensing devices and, more particularly, to a process flow for forming thermally isolated MOS sensors (TMOS) incorporating mechanical stoppers to increase robustness to mechanical shocks.

BACKGROUND

Thermal sensors are used in a variety of devices to determine the temperature of desired targets and function by sensing infrared radiation. For example, certain types of thermal sensors can be used to determine the body temperature of a human being from a distance, while other types of thermal sensors can be used to determine the body temperature of a human being by being inserted into the ear canal.

Conventionally, thermal sensing may be performed utilizing a thermocouple. A thermocouple is formed by two junctions between two dissimilar electrical conductors—a reference junction and a sensing junction. When there is a temperature difference between the sensing junction and the reference junction, a temperature-dependent voltage is generated as a result of the Seebeck effect.

Another conventional way thermal sensing may be performed is to use an image sensor that is sensitive to electromagnetic radiation in the infrared spectrum. A known thermal sensing pixel 5 is now described with reference to its top view shown in FIG. 1A and its cross-sectional view (taken along line A-A) shown in FIG. 1B. The thermal sensing pixel 5 includes a bottom cap 11 having a cavity 16 formed into the front face thereof. In some prior art applications, the bottom cap 11 may be an ASIC.

A frame 12 is carried by the front face of the bottom cap 11. A mass 13 is suspended over the cavity 16 by springs 14 extending between the frame 12 and connection points at the perimeter of the mass 13. The mass 13 includes active area(s) 2 containing desired integrated circuits. For example, the active area(s) 2 may contain CMOS devices or may contain thermally isolated MOS sensors (TMOS). In the following description, the example of TMOS sensors being contained by the active area(s) 2 will be used, but understand that the TMOS sensors may be replaced with any desired integrated circuits in the given examples.

A top cap 10 is affixed to the front face of the frame 12. The springs 14 serve to thermally isolate the mass 13 from the frame 12 due to the springs 14 having a low thermal conductivity, thereby allowing for the TMOS sensors 2 to be used to detect a temperature representative of an ambient temperature within the thermal sensing pixel 5 as well as the temperature of incident infrared radiation.

The integration of such slim springs 14 on each pixel 5 with in array thereof poses issues during mechanical testing and when undergoing mechanical shock, particularly when subjected to repeated random drop test cycles (for example, tumbled). Due to the flexibility of such springs 14, during mechanical shocks, the mass 13 may bounce sufficiently to either damage the springs 14 or contact the interior surface of the top cap 10 or the bottom cap 11. This can reduce yield when it occurs during device testing, or can reduce robustness of the device into which the thermally sensing pixel 5 is implemented.

In an attempt to address this issue, the top cap 10 may include projections 17 extending downwardly toward the springs 14 to act as a "stopper" and limit the range of motion of the springs 14. However, these projections 17 may be detrimental to the resulting sensitivity of the thermal sensing pixel 5 and may limit the field-of-view of the thermal sensing pixel 5. As such, further development is needed.

SUMMARY

Disclosed herein is a method of forming a thermal sensing pixel. The method includes: providing a base substrate having a buried oxide layer thereon, with a silicon layer being on the buried oxide layer, whereby the buried oxide layer and silicon layer are selectively etchable to form a frame structure, spring structures, and a central structure; forming an active layer within the silicon layer to include at least one integrated circuit therein, the at least one integrated circuit formed in a position overlying the central structure; forming a first insulator layer on the active layer; forming a first metal layer in the first insulator layer, with metallized portions of the first metal layer overlying the spring structures; forming a second insulator layer on the first metal layer; forming a second metal layer in second insulator layer, and with a central metallized portion of the second metal layer overlying the at least one integrated circuit and central structure; forming a third insulator layer on the second metal layer; and forming a third metal layer in the third insulator layer.

The method further includes: performing an etch to remove the third insulator layer, portions of the second insulator layer except those underlying metallized portions of the third metal layer, and portions of the first insulator layer except those underlying metallized portions of the third metal layer and second metal layer, as well as portions of the silicon layer and buried oxide layer underlying metallized portions of the third metal layer, second metal layer, and first metal layer to thereby form the frame structure, spring structures, and central structure; and removing the metallized portions of the third metal layer, second metal layer, and first metal layer to thereby form a frame defined by the frame structure, springs defined by the spring structures, and mass defined by the central structure, with a first stopper being defined by exposed portions of a bottom surface of the second insulator layer.

The second metal layer may also be formed to include peripheral portions overlying certain metallized portions of the first metal layer. The metallized portions of the third metal layer may overly the peripheral metallized portions of the second metal layer but not the metallized portions of the first metal layer, and metallized portions of the third metal layer may overly the peripheral metallized portions of the second metal layer. The etch may also fail to remove the peripheral metallized portions of the second metal layer. The peripheral metallized portions of the second metal layer may be formed. The first stopper may constrain movement of the spring in a first direction.

A thickness of the first stopper may be defined by a distance between the second metal layer and the first metal layer.

Metallized portions of the third metal layer may overlay the metallized portions of the first metal layer.

A thickness of the first stopper may be defined by a distance between the third metal layer and the first metal layer.

The second metal layer may also be formed to include peripheral portions overlying certain metallized portions of the first metal layer. The method may include, prior to formation of the first metal layer forming first vias extending through the first insulator layer, silicon layer, and buried oxide layer to reach the substrate.

The metallized portions of the first metal layer may be formed to overly the first vias. A second via may be formed through the second insulator layer to reach a top surface of a metallized portion of the first metal layer. Removal of the metallized portions of the first metal layer may also remove material forming the first vias.

Removal of the peripheral metallized portions of the second metal layer may also remove material forming the second via. Removal of the material forming the first vias and the second vias may define a pillar extending upwardly from the first insulator layer, with a second stopper being defined by exposed portions of a bottom surface of the second insulator forming the pillar. The second stopper may constrain movement of the spring in a second direction opposite to the first direction.

The metallized portions of the third metal layer may overly at least one of the peripheral metallized portions of the second metal layer so that removal of the peripheral metallized portions of the second metal layer defines a third stopper formed by exposed portions of a bottom of the third insulator layer.

The method may also include forming a fourth insulator layer on the third metal layer; and forming a fourth metal layer on the fourth metal layer. The etch may also remove the fourth insulator layer except portions thereof underlying metallized portions of the fourth metal layer. The metallized portions of the fourth metal layer may also be removed.

The method may further include affixing a top cap over the third insulating layer after the removal of the metallized portions of the third metal layer, second metal layer, and first metal layer. The at least one integrated circuit may be at least one thermally isolated MOS (TMOS) sensor.

Also disclosed herein is method of forming a thermal sensing pixel, including: providing a base substrate having a buried oxide layer thereon, with a silicon layer being on the buried oxide layer, whereby the buried oxide layer and silicon layer are selectively etchable to form a frame structure, spring structures, and a central structure; forming an active layer within the silicon layer to include at least one integrated circuit therein, the at least one integrated circuit formed in a position overlying the central structure; forming a first insulator layer on the active layer; forming a first metal layer in the first insulator layer, with metallized portions of the first metal layer overlying the spring structures; forming a second insulator layer on the first metal layer; and forming a second metal layer in second insulator layer, and with a central metallized portion of the second metal layer overlying the at least one integrated circuit and central structure.

The method may also include: performing an etch to remove the third insulator layer, portions of the second insulator layer except those underlying metallized portions of the first insulator layer except those underlying metallized portions of the second metal layer, as well as portions of the silicon layer and buried oxide layer underlying metallized portions of the second metal layer and first metal layer to thereby form the frame structure, spring structures, and central structure; and removing the metallized portions of the second metal layer and first metal layer to thereby form a frame defined by the frame structure, springs defined by the spring structures, and mass defined by the central structure, with a first stopper being defined by exposed portions of a bottom surface of the second insulator layer.

The second metal layer may also be formed to include peripheral portions overlying certain metallized portions of the first metal layer. The etch may also fail to remove the peripheral metallized portions of the second metal layer. The method also may include forming the peripheral metallized portions of the second metal layer. The first stopper may constrain movement of the spring in a first direction.

The second metal layer may also be formed to include peripheral portions overlying certain metallized portions of the first metal layer. The method may also include, prior to formation of the first metal layer, forming first vias extending through the first insulator layer, silicon layer, and buried oxide layer to reach the substrate. The metallized portions of the first metal layer may be formed to overly the first vias. The method may also include forming a second via through the second insulator layer to reach a top surface of a metallized portion of the first metal layer.

Removal of the metallized portions of the first metal layer may also remove material forming the first vias. Removal of the peripheral metallized portions of the second metal layer may also remove material forming the second via. Removal of the material forming the first vias and the second vias may define a pillar extending upwardly from the first insulator layer, with a second stopper being defined by exposed portions of a bottom surface of the second insulator forming the pillar. The second stopper may constrain movement of the spring in a second direction opposite to the first direction.

The method may also include affixing a top cap over the second insulating layer after the removal of the metallized portions of the second metal layer and first metal layer.

The at least one integrated circuit may be at least one thermally isolated MOS (TMOS) sensor.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown but is to be accorded the widest scope consistent with the principles and features disclosed or suggested herein.

Figures 1A, 1B:
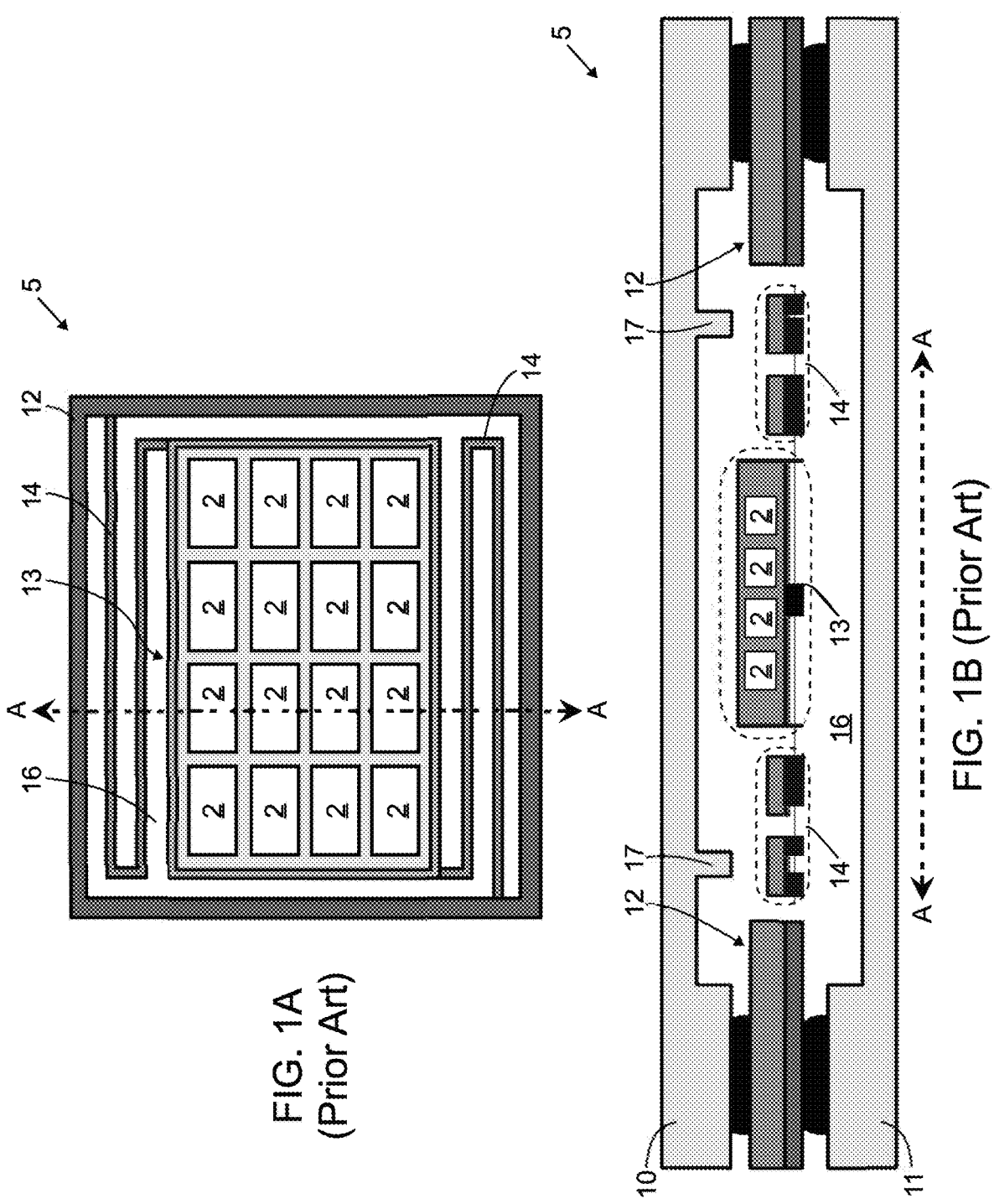
FIG. 1A is a top view of a known temperature sensing pixel.
FIG. 1B is a cross-sectional view of the temperature sensing pixel of FIG. 1A.
Figure 2:
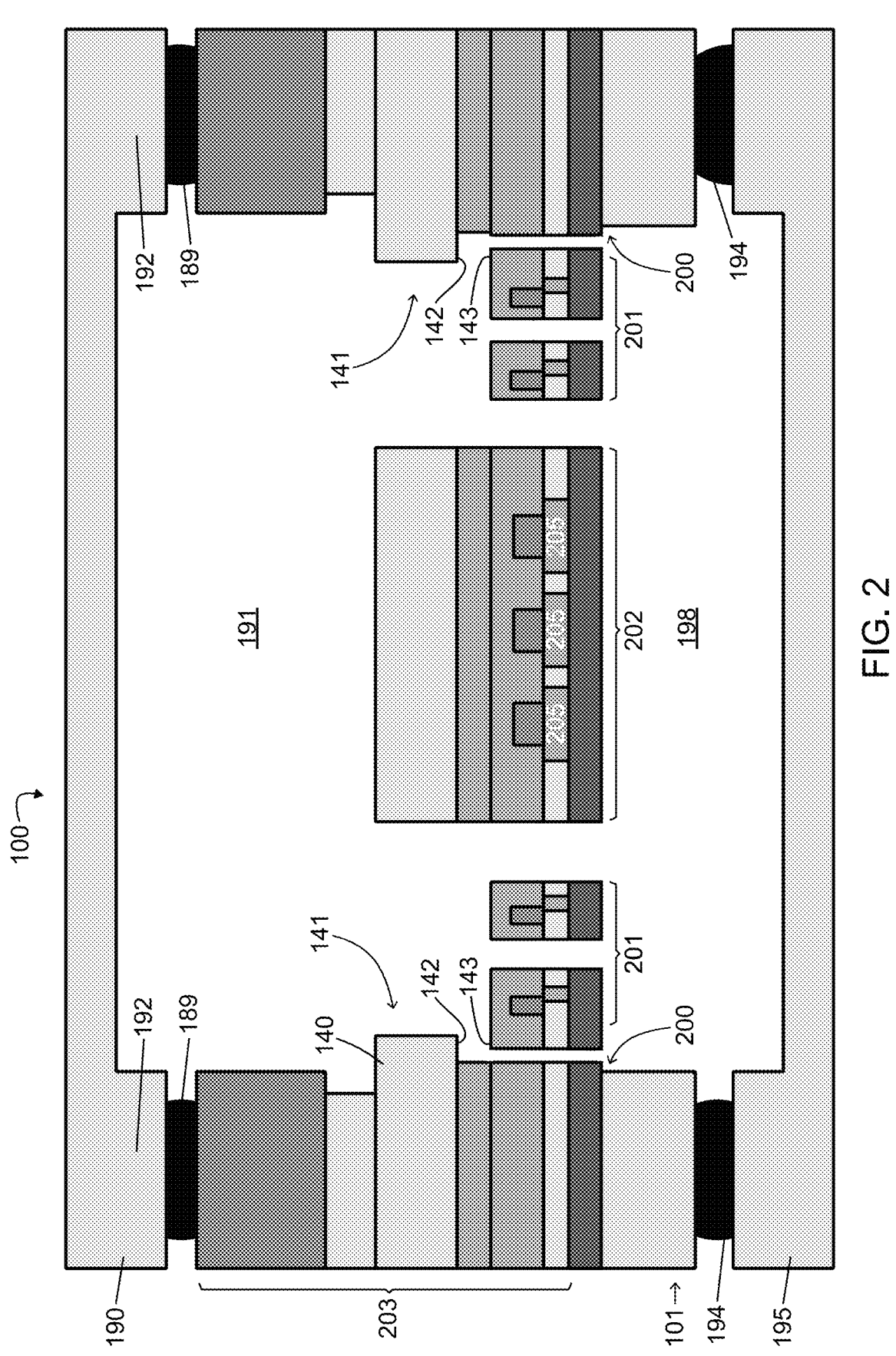
FIG. 2 is a cross-sectional view of a temperature sensing pixel disclosed herein.

Now disclosed is a thermal sensing pixel 100, shown in cross section in FIG. 2.

The thermal sensing pixel 100 includes a substrate 101 having a cavity 198 formed into the back face thereof, with sidewalls of the substrate 101 defining the cavity 198. A frame 200 is mechanically connected the front face of the substrate 101 at the tops of the sidewalls of the substrate 101. A mass 202 is suspended over the cavity 198 by springs 201 extending between the frame 200 and connection points at the perimeter of the mass 202. The mass 202 includes active area(s) 205 containing thermally isolated MOS sensors (TMOS).

Sidewalls 192 of a top cap 190 surround a cavity 191 defined within the bottom face of the top cap 190 and are hermetically sealed to the top of sidewalls 203 formed by a series of insulating layers (described below), with it being understood that the cavities 191 and 198 are in fluid communication but are environmentally sealed from the exterior of the thermal sensing pixel 100. A bottom cap 195 is bonded to the back face of the substrate 101, and a getter (not shown) may be disposed on the interior surface of the bottom cap 195. A reflective coating (not shown) may be disposed on the interior surface of the top cap 190.

Observe that the shape of the stoppers 141 formed laterally extending from the sidewalls 203 constrains upward movement of the springs 201 because the top surface of the springs 201 will contact the bottom surface of the stoppers 141 as those springs travel upwards. In particular, during operation, upward movement of the left-side spring 201 results in the upper surface 143 of the insulator layer at the end of the left-side spring 201 connected to the frame 200 making contact with the bottom surface 142 of the left-side spacer 140, stopping the upward movement of the left-side spring 201, and results in the upper surface 143 of the insulator layer 120 at the end of the right-side spring 201 connected to the frame 200 making contact with the bottom surface 142 of the right-side spacer 140, stopping the upward movement of the right-side spring 201. This in turn constrains upward movement of the mass 202. In addition to providing this benefit, by being formed laterally extending into the cavity 191 from the sidewalls 203, the stoppers 141 avoid the problems described above of obscuring the field of view of the TMOS devices 205 and of reducing the sensitivity of the resulting thermal sensing pixel 100.

A process flow for forming the thermal sensing pixel 100 is now described with reference to FIGS. 3A-3H.

Figures 3A, 3B, 3C:
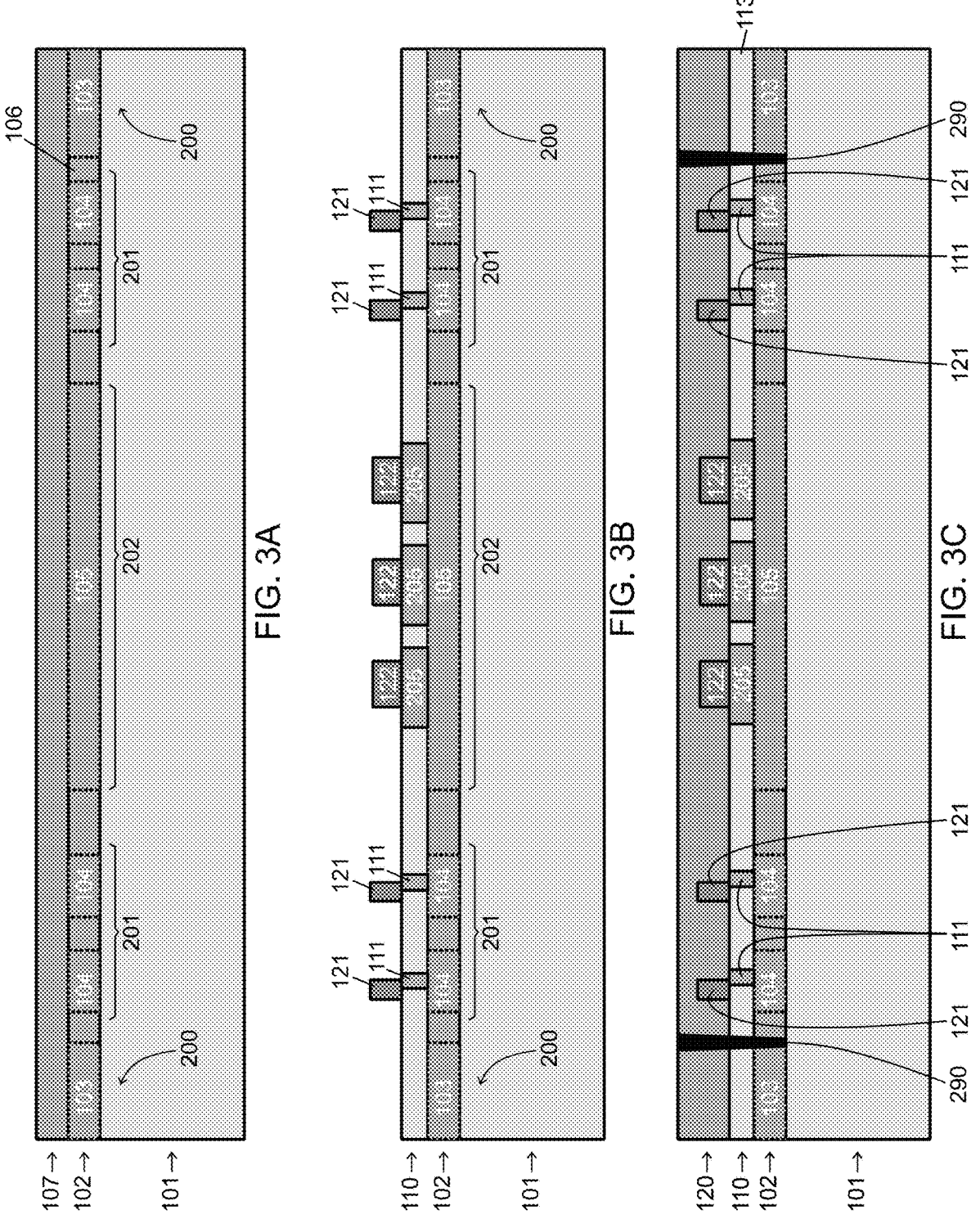
FIGS. 3A-3I are a series of cross-sectional views showing a process flow for forming the temperature sensing pixel of FIG. 2.

Initially, as shown in FIG. 3A, a buried oxide layer 102 is formed atop the substrate 101 and a thin silicon layer 107 is formed atop the buried oxide layer 102. The buried oxide layer 102 will ultimately be etched to include base frame substrate 103 (forming part of the frame 200), base spring substrates 104 (forming part of the springs 201), and a base mass substrate 105 (forming part of the mass 202). This structure may be recognized as a semiconductor on insulator (SOI) type substrate.

Gate insulators are then formed on the thin silicon layer 107 and a polysilicon layer 110 is deposited over the thin silicon layer 107, and the polysilicon layer 100 is then patterned to form gates 122 and interconnections 121, as shown in FIG. 3B. Active regions 205 (e.g., drain, source, body) are then formed within the thin silicon layer 107 via implantation, and the layer 107 may now therefore be referred to as an active layer 110. Also formed within the thin silicon layer 107 are interconnections 111. The active regions 205 form TMOS elements. Optionally, shallow trench isolations (not shown) may be formed surrounding the active regions 205.

Figures 3D, 3E:
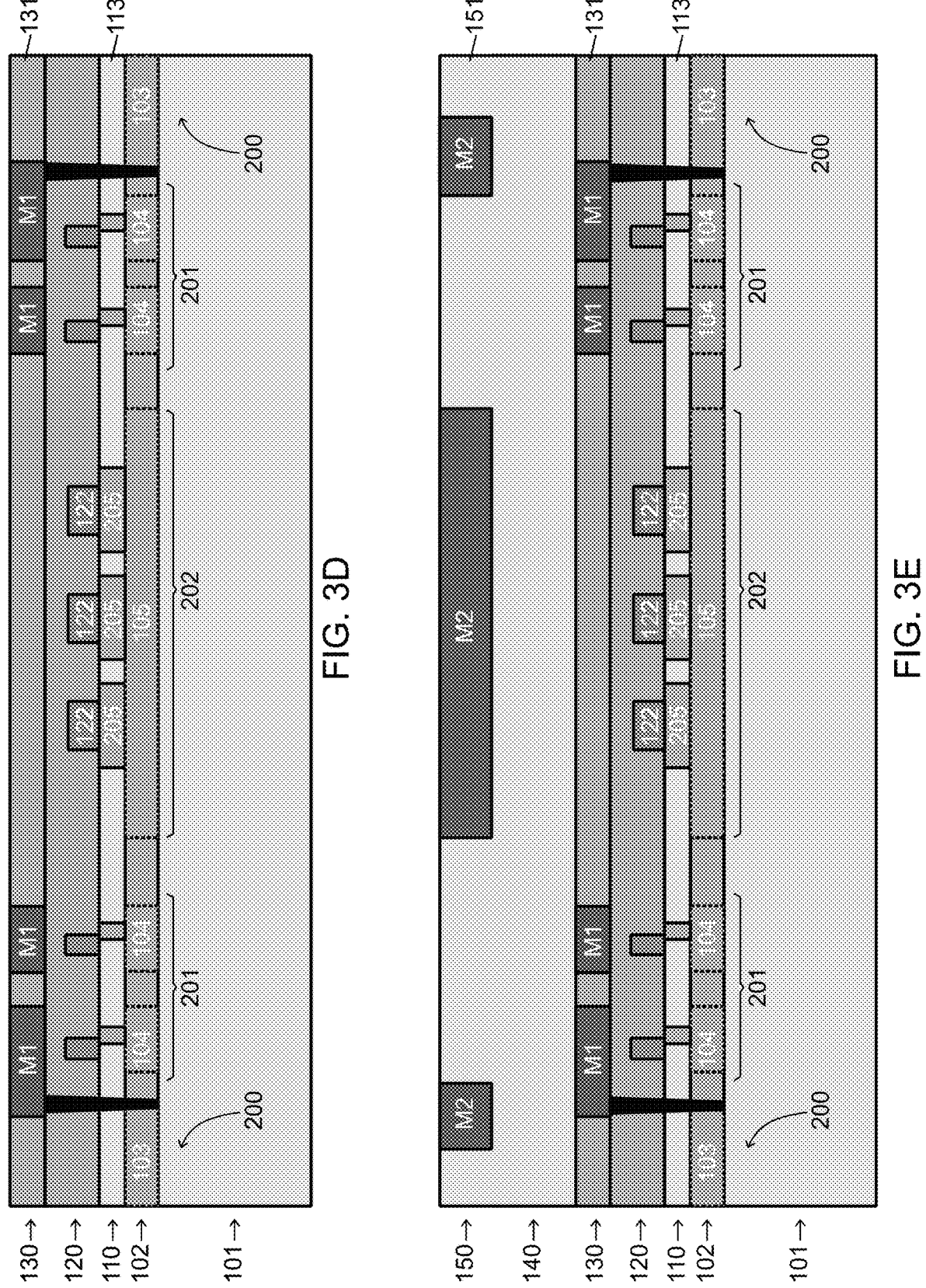

A pre-metallization dielectric 120 (e.g., insulator layer) is then deposited over the active layer 110, gates 122, and interconnections 121, as shown in FIG. 3C. The pre-metallization dielectric 120 is then planarized and vias 290 are formed therein, as also shown in FIG. 3C which extend from the planarized upper surface of the layer 120 through to at least the top surface of the substrate 101. These vias 290 are formed by etching a through opening and then filling the through opening with a metal material. A first metal layer 130 is formed atop the insulator layer 120 through the formation of metal lines M1, and the deposition and thinning of insulating material 131, as shown in FIG. 3D. Observe the locations of the patterned metal M1 directly overlying the interconnections 121 of the springs 201 as well as the vias 290. As will be explained below, the patterned metal M1 within the first metal layer 130 is used as an etch mask for defining, in part, the springs 201.

Another pre-metallization dielectric 140 (e.g., insulator layer) is formed atop the first metal layer 130, and a second metal layer 150 is formed within the layer 140, as shown in FIG. 3E. The second metal layer 150 is constructed through the formation of metal M2 within the insulating material 151 of the pre-metallization dielectric 140. Observe the locations of the patterned metal M2 partially (but not completely) overlying the patterned metal M1—the patterned metal M2 within the second metal layer 150 is also used as an etch mask, here to (in combination with the patterned metal M1) form the stoppers 141.

Figure 3F:
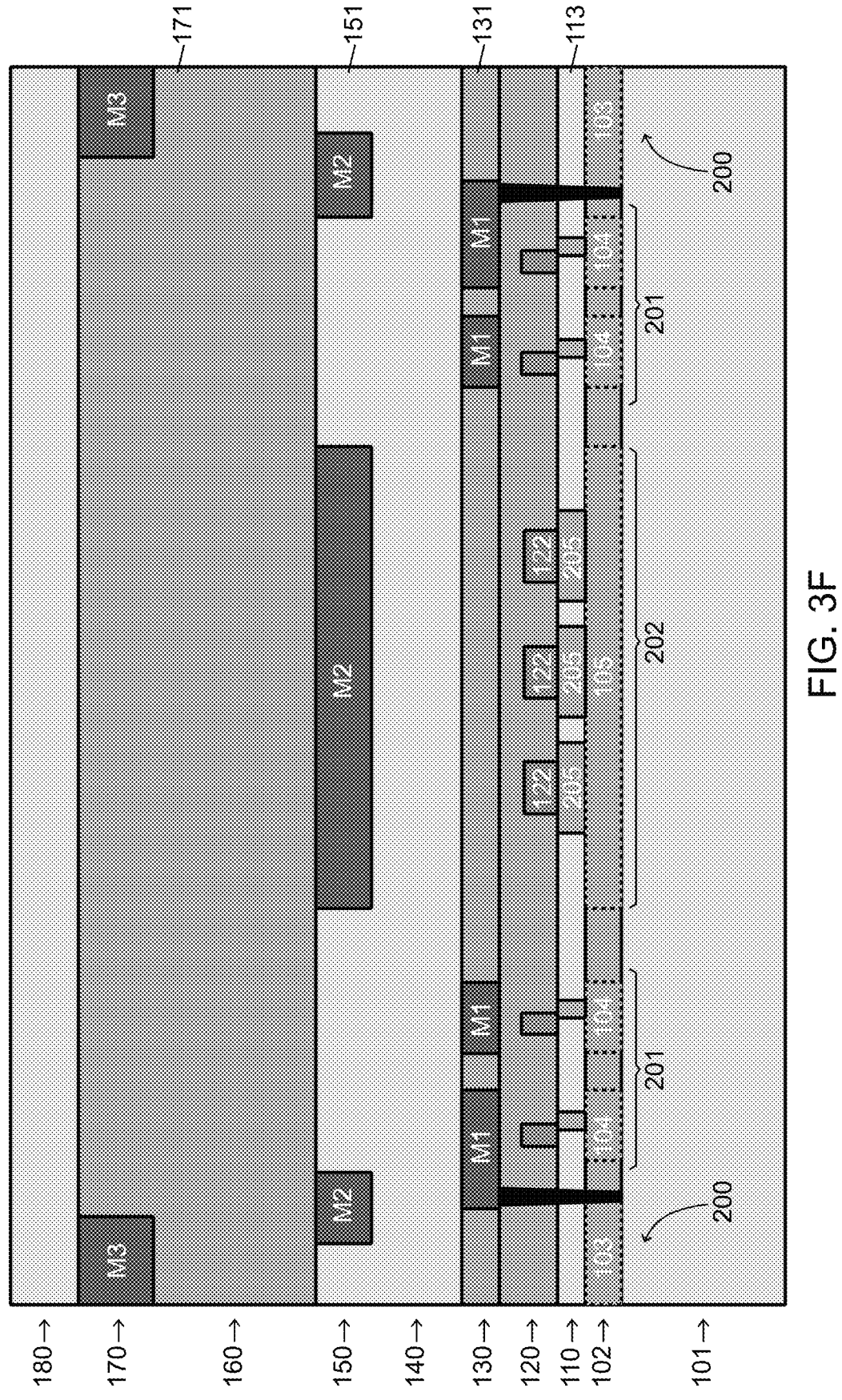

An insulator layer 160 is formed atop the pre-metallization dielectric 140, a third metal layer 170 is formed within the insulator layer 160, and an insulator layer 180 is formed atop the insulator layer 160, as shown in FIG. 3F. The third metal layer 170 is formed through the formation of metal M3 within the insulating material 161 of the insulator layer 160. Observe the locations of the patterned metal M3 partially (but not completely) overlying the patterned metal M2.

Figure 3G:
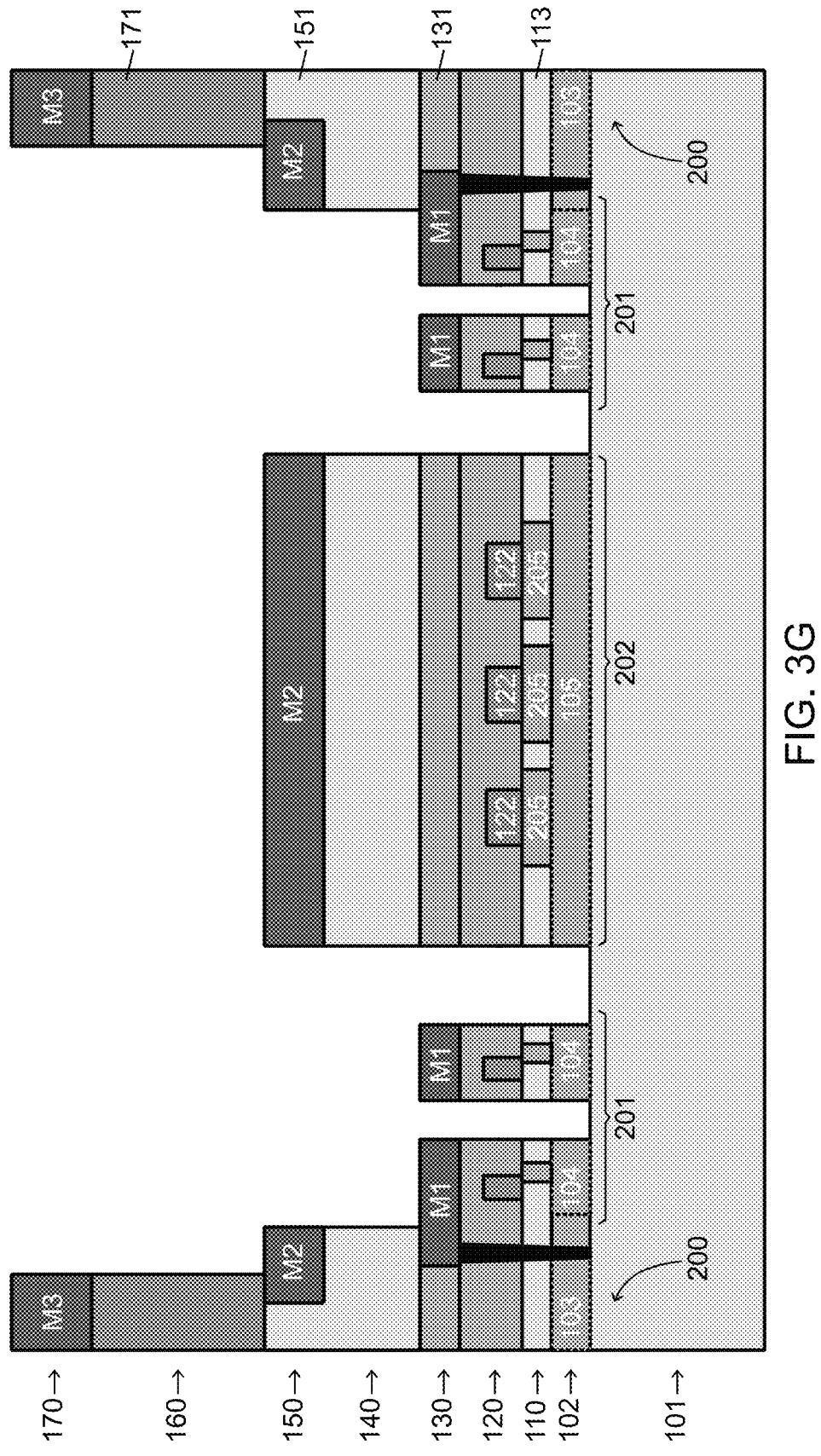

As shown in FIG. 3G, an anisotropic blind etch is then performed, with this blind etch being selective as to the insulative materials within the layers 130, 140, 160, and 180. The blind etch therefore removes the insulator layer 180, insulator layer 160 except the portions thereof directly under the patterned metal M3, insulator layer 140 except portions thereof directly under the patterned metal M3 and portions thereof directly under the patterned metal M3 and M2, as well as the insulating material 131, insulator layer 120, active layer 110, and buried oxide layer 102 except portions thereof directly under the patterned metal M3, M2, and M1—the metal layers M3, M2, and M1 have acted as a mask or etch stop. Note that by the etch removing portions of the layers 110 and 102, the frame 200 and springs 201 are partially defined.

Figure 3H:
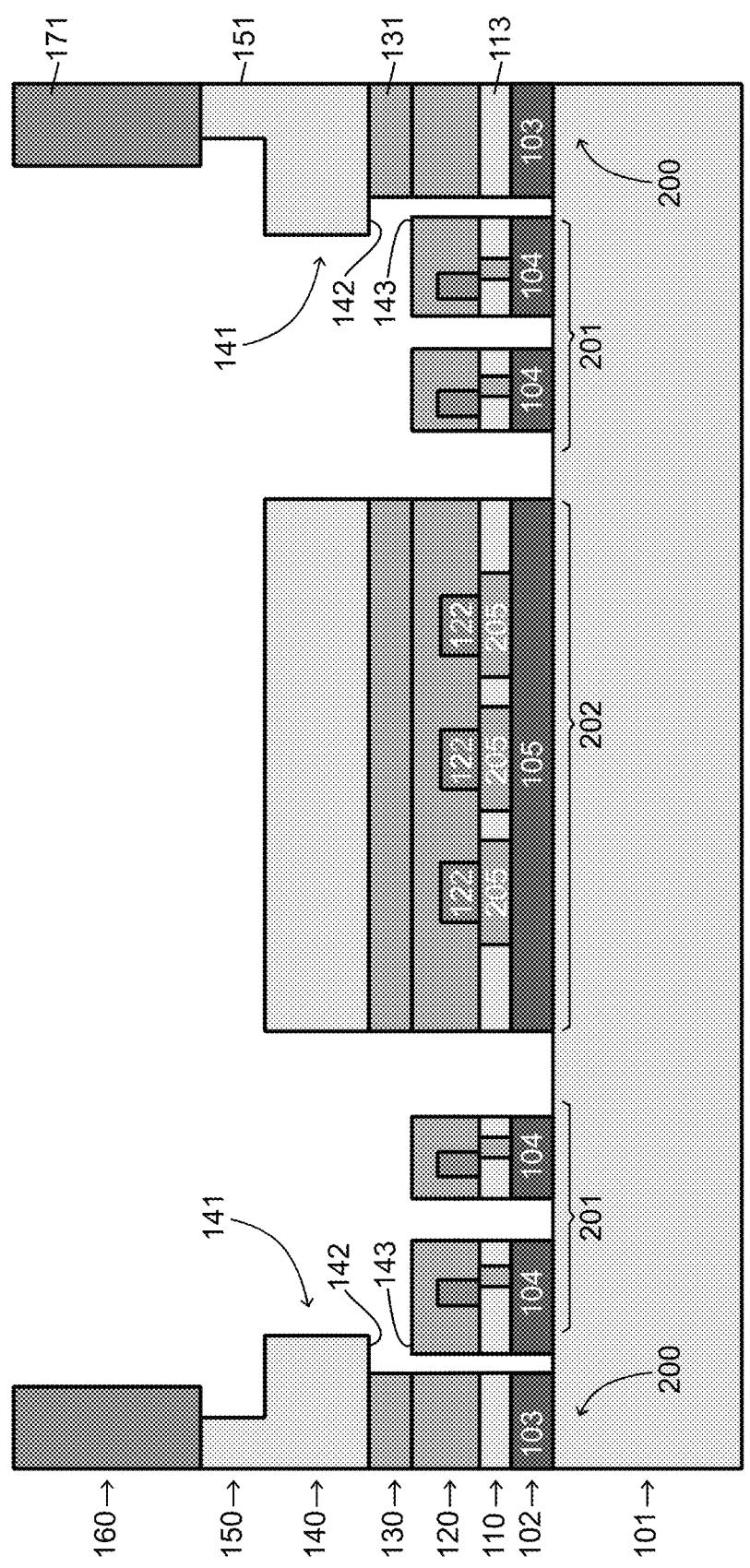

The patterned metal M3, M2, and M1 is then removed by performing of an isotropic etch, with this etch being selective as to the material used to form the metal M3, M2, and M1 as well as the vias 290. The etch thereby forms the frame 200, springs 201, and mass 202. The removal of the patterned metal M3, M2, and M1 also forms the stoppers 141 to constrain upward movement of the springs 201, as shown in FIG. 3H. Due to the use of the metal layers M3, M2, and M1 as an etch stop, the thickness of the stoppers 141 is defined by the distance between the first and second metal layers 130, 150. Notice that the bottom surfaces 143 of the stoppers 141 are formed by the exposed bottom surfaces of the remaining portions of the insulator layer 140 above the metal M1 after removal of the metal M1.

Figure 3I:
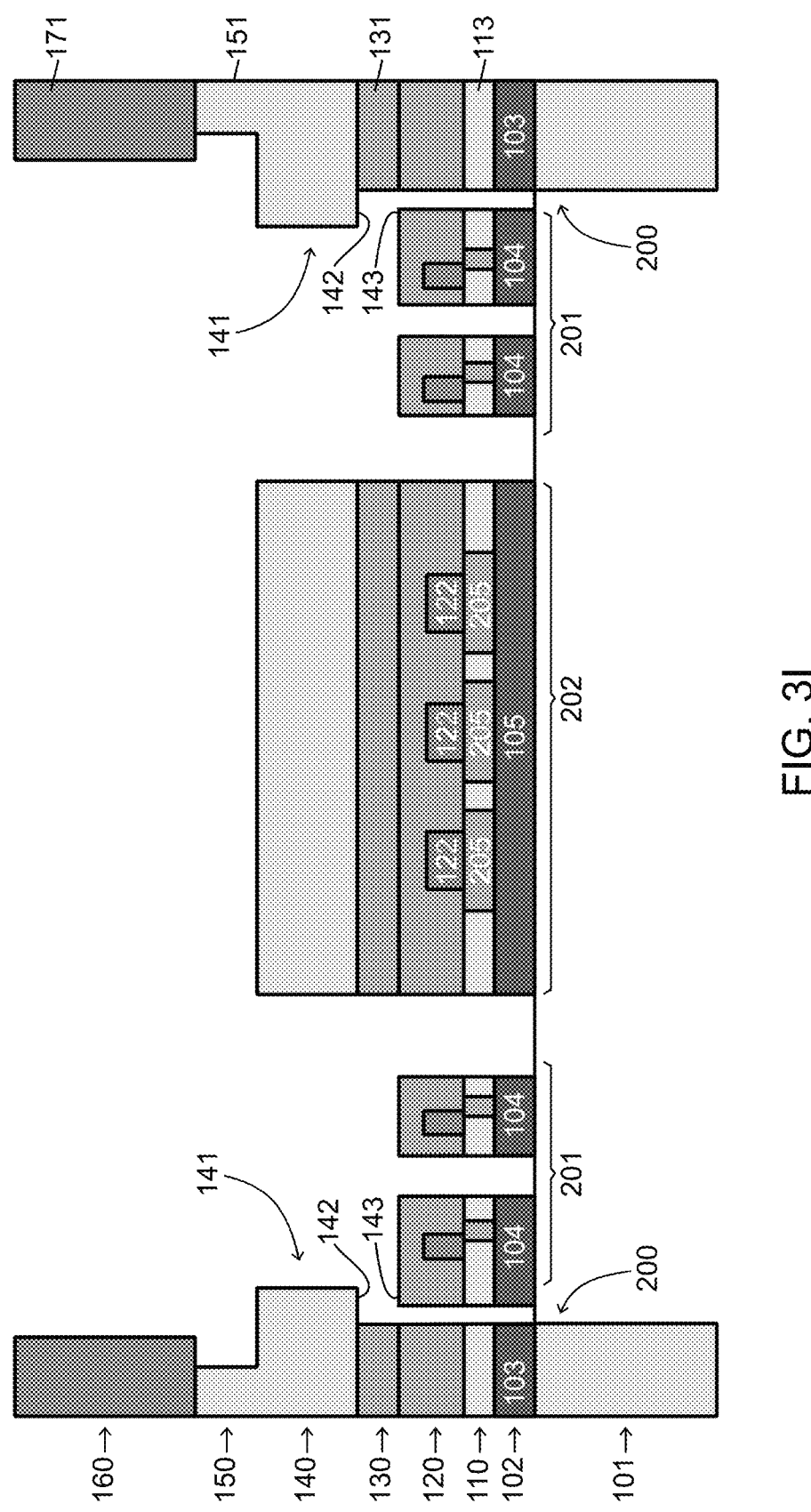

The removal of the patterned metal M3, M2, and M1 also removes the material within the vias 290. The back side of the substrate 101 is then anisotropically etched to release the springs 201 and mass 202, forming the cavity 198 as shown in FIG. 3I, with this etch being selective as to the material within the substrate 101. The bottom cap 195 is then bonded to the back face of the substrate 101 over the cavity 198, and the top cap 190 is bonded to the top face of layer 160 to thereby produce the thermal sensing pixel 100 shown in FIG. 2.

As an alternative, the top cap 190 may be bonded to the front face of layer 160 prior to anisotropic etching of the back side of the substrate 101 and prior to the bonding of the bottom cap 195 to the back face of the substrate 101. In this instance, the anisotropic etching of the back side of the substrate 101 is performed after bonding of the top cap 190 and thereafter the bottom cap 195 is bonded to the back face of the substrate.

A variation of this process flow is now described with reference to FIGS. 4A-4D. The result of this process flow is to form thicker stoppers 141 defined by the distance between the first and third metal layers 130, 170. The function of the stoppers 141 during operation to constrain upward movement of the left-side spring 201 via the upper surface 143 of the insulator layer 120 at the end of the left-side spring 201 connected to the frame 200 making contact with the bottom surface 142 of left-side portion 140 the left-side spacer 140, and to constrain upward movement of the right-side spring 201 via the upper surface 143 of the insulator layer 120 at the end of the right-side spring 201 connected to the frame 200 making contact with the bottom surface 142 of the right-side spacer 140. This in turn constrains upward movement of the mass 202.

Figure 4A:
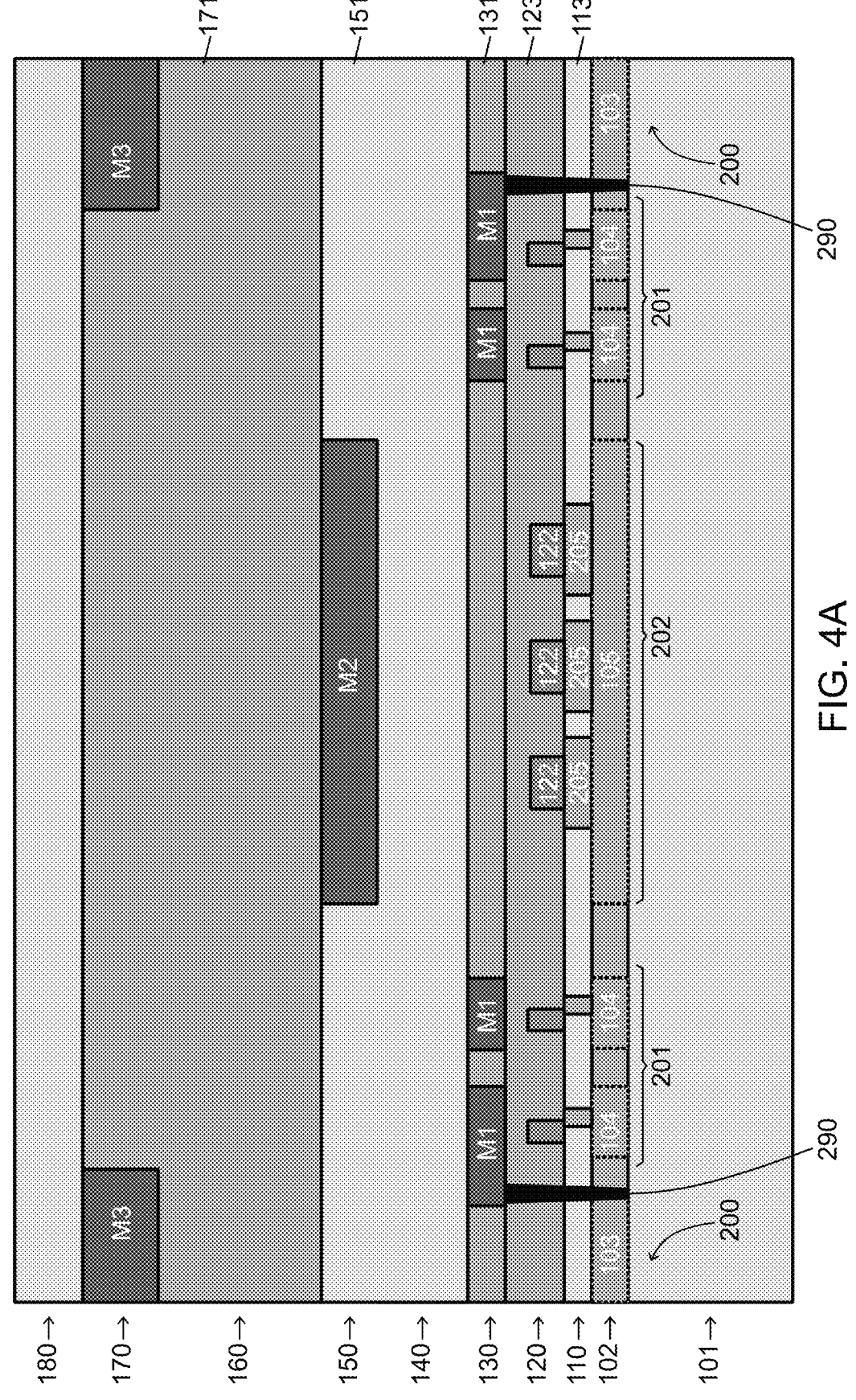
FIGS. 4A-4D are a series of cross-sectional views showing an alternative process flow for forming a temperature sensing pixel.
Figure 4B:
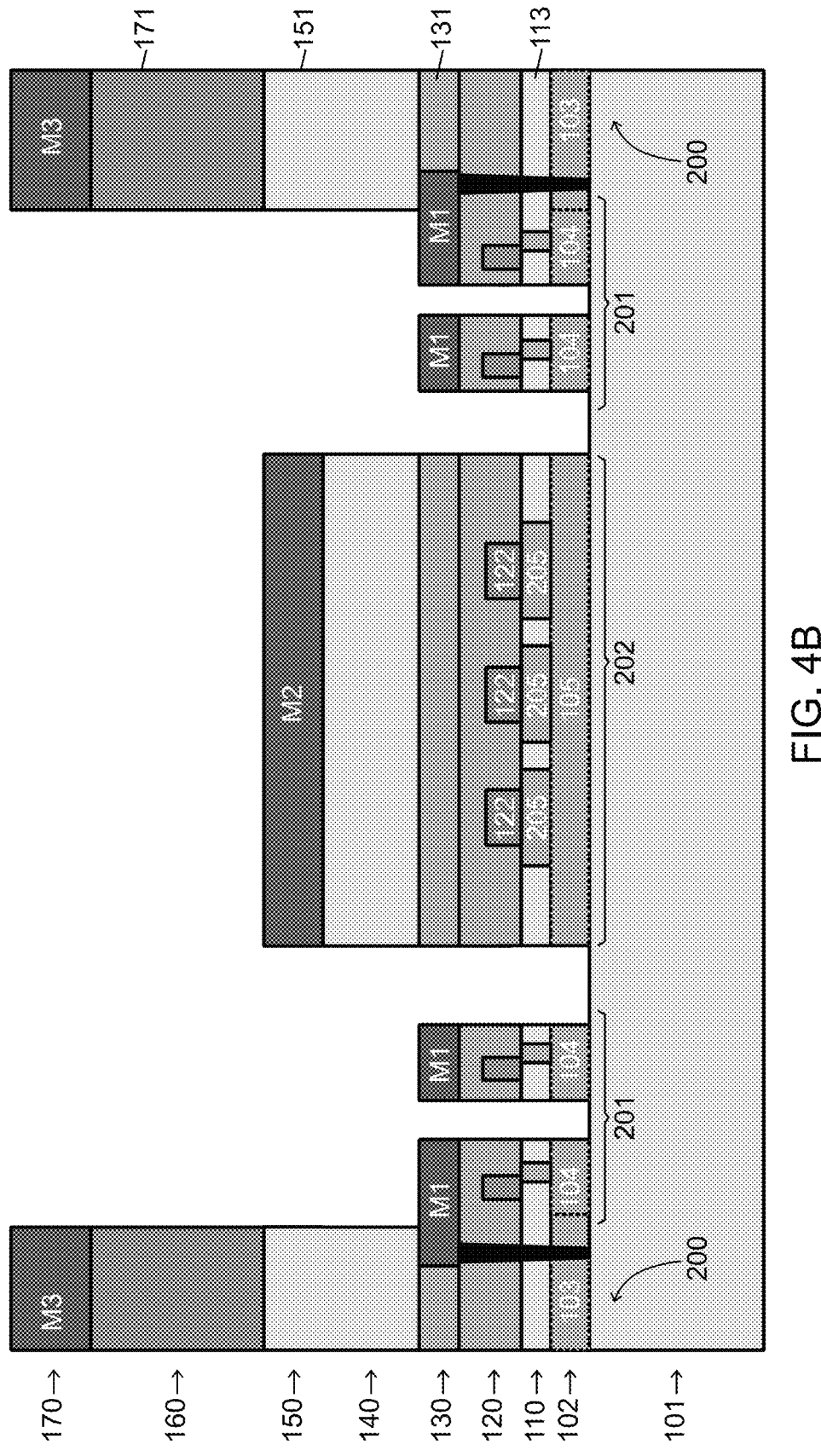
Figure 4C:
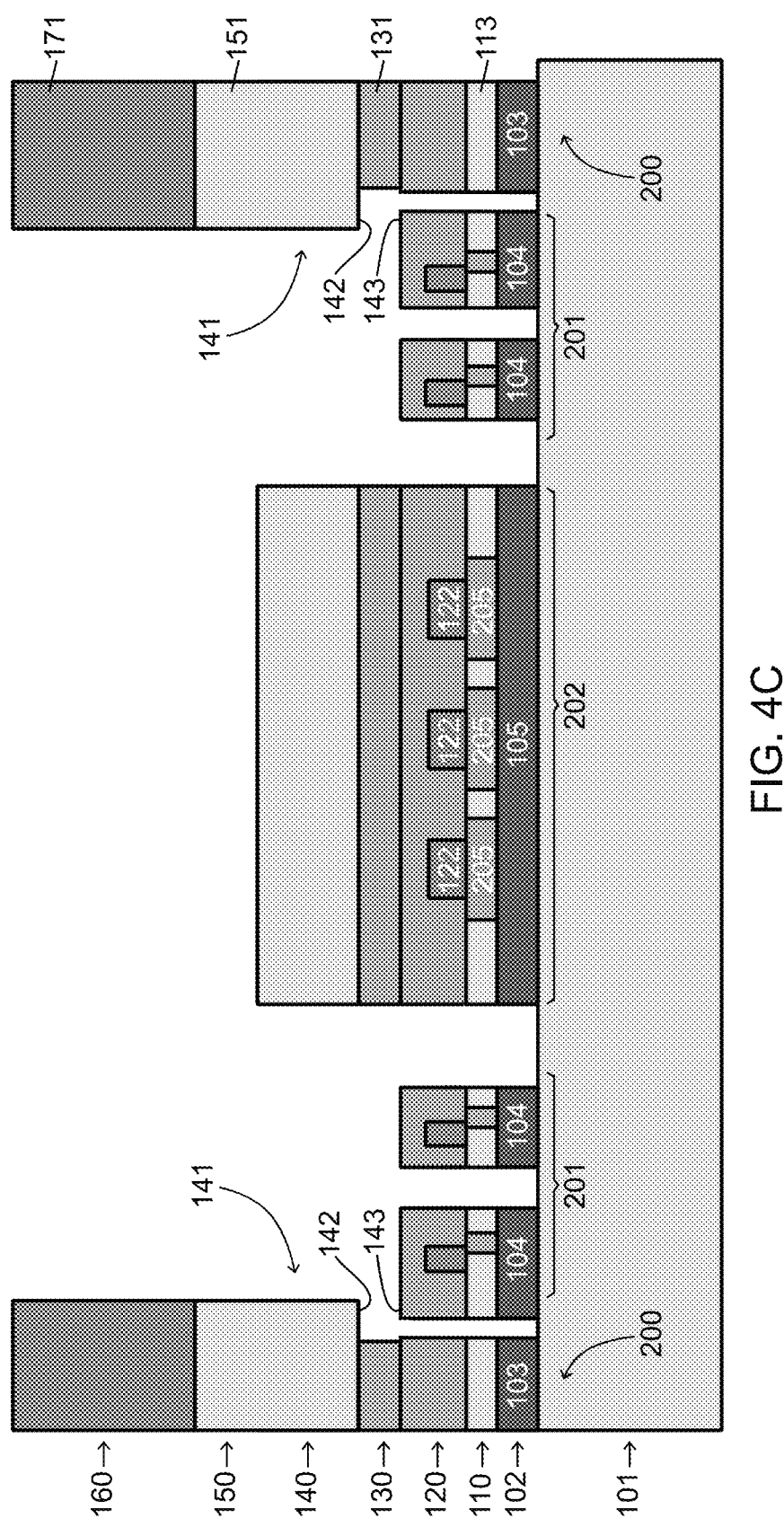
Figure 4D:
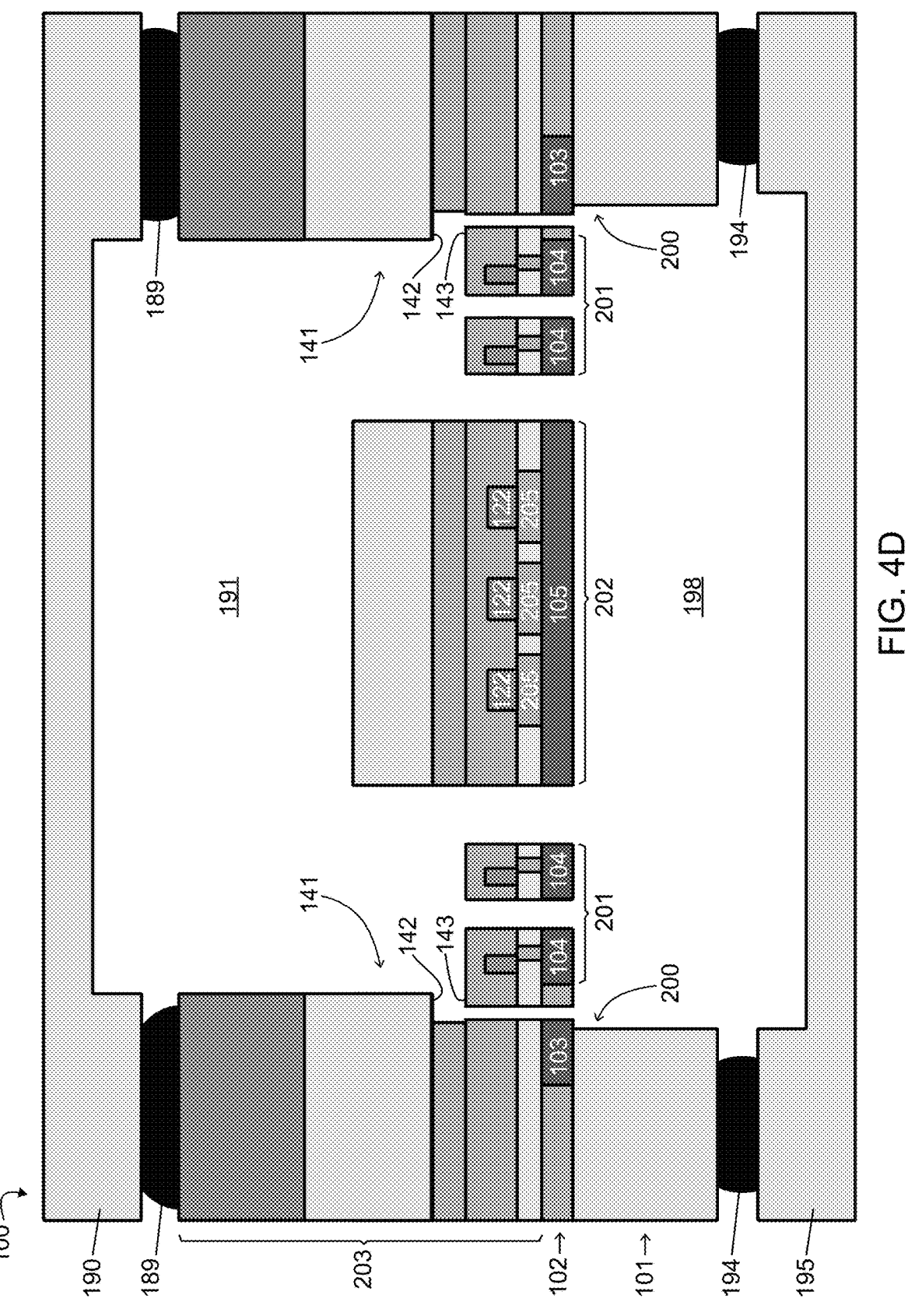

The process flow step shown in FIG. 4A corresponds to that shown in FIG. 3E of the prior embodiment. Notice here that in the second metal layer 150, the patterned metal M2 overlying the mass 202 remains, while the patterned metal M2 overlying portions of the patterned metal M1 of the first metal layer 130 is not present. As such, when the etch which corresponds to that shown in the prior embodiment FIG. 3F is performed, the portions of the insulator layer 160 and insulator layer 140 remaining directly underneath the third metal M3 are greater in width than the insulating material 131, as shown in FIG. 4B. As such, the upper stoppers 141 formed are wider (and uniform in width), as shown in FIG. 4C, which corresponds to FIG. 3G in the prior embodiment, producing the thermal sensing pixel 100' shown in FIG. 4D.

Before describing another variation, observe that in the process flow of FIGS. 3A-3G and FIGS. 4A-4D, vias 290 are symmetrically located—with reference to the cross-sectional views, the left edge of the left via 290 aligns with the left edge of the leftmost metal M1, and the right edge of the right via 290 aligns with the right edge of the rightmost metal M1.

Now described with reference to FIGS. 5A-5D is a process flow in which this is not the case. Indeed, as can be observed in FIGS. 5A-5B, while the left edge of the left via 290 aligns with the left edge of the leftmost metal M1, the left edge of the right via 290 aligns with the left edge of the rightmost metal M1. The result of that is when the insulator layer 180, insulating material 171, insulator layer 160 except the portions thereof directly under the patterned metal M3, insulator layer 140 except portions thereof directly under the patterned metal M3 and M2, as well as insulating material 131, insulator layer 120, active layer 110, and buried oxide layer 102 except portions thereof directly under the patterned metal M3, M2, and M1 are removed, the stopper 141 on the left acts as an upper stopper to constrain upward movement of the mass 202 while the stopper 146 on the right acts as a lower stopper to constrain downward movement of the mass 202.

Observe first that the shape of the stopper 141 formed from the left-side sidewall 203 constrains upward movement of the left-side spring 201 because the top surface of the left-side spring 201 will contact the bottom surface of the stopper 141 as the left-side spring travels upwards. In particular, during operation, upward movement of the left-side spring 201 results in the upper surface 143 of the insulator layer 120 at the end of the left-side spring 201 connected to the frame 200 making contact with the bottom surface 142 of the left-side spacer 140, stopping the upward movement of the left-side spring 201 and in turn constraining the upward movement of the mass 202. Observe now that the shape of the stopper 146 formed from the portion 145 of the second insulator layer 140 detached from the right-side sidewall 203 constrains downward movement of the right-side spring because the stopper 146 is carried by the right-side spring 201 itself. Thus, downward movement of the right-side spring 201 results in the bottom surface of the stopper 146 making contact with the exposed top surface 125 of the insulator layer, stopping the downward movement of the right-side spring 201 and in turn constraining the downward movement of the mass 202. Therefore, in this example, the mass 202 is constrained from both upward and downward movement.

Figure 5A:
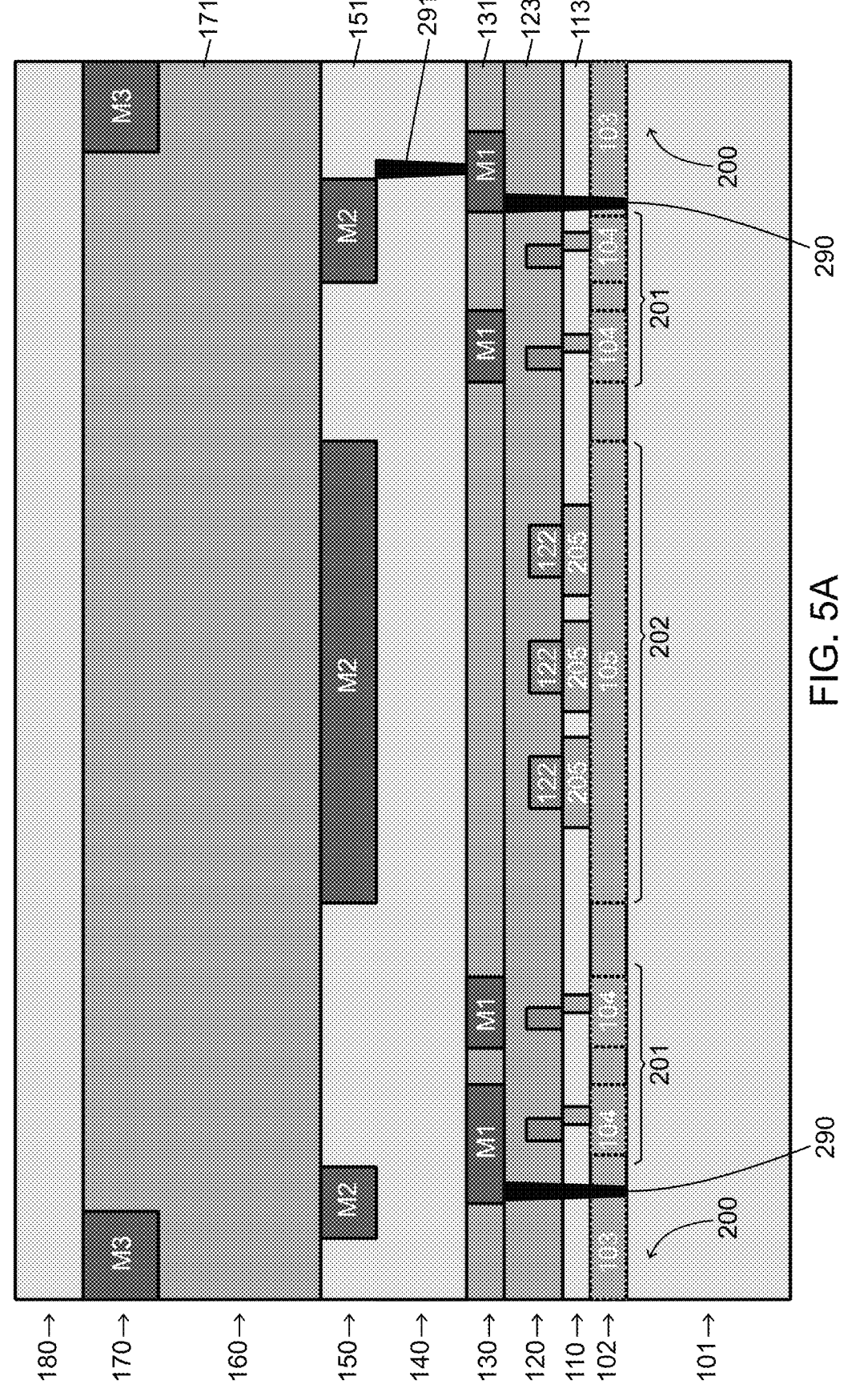
FIGS. 5A-5D are a series of cross-sectional views showing another process flow for forming a temperature sensing pixel.
Figure 5B:
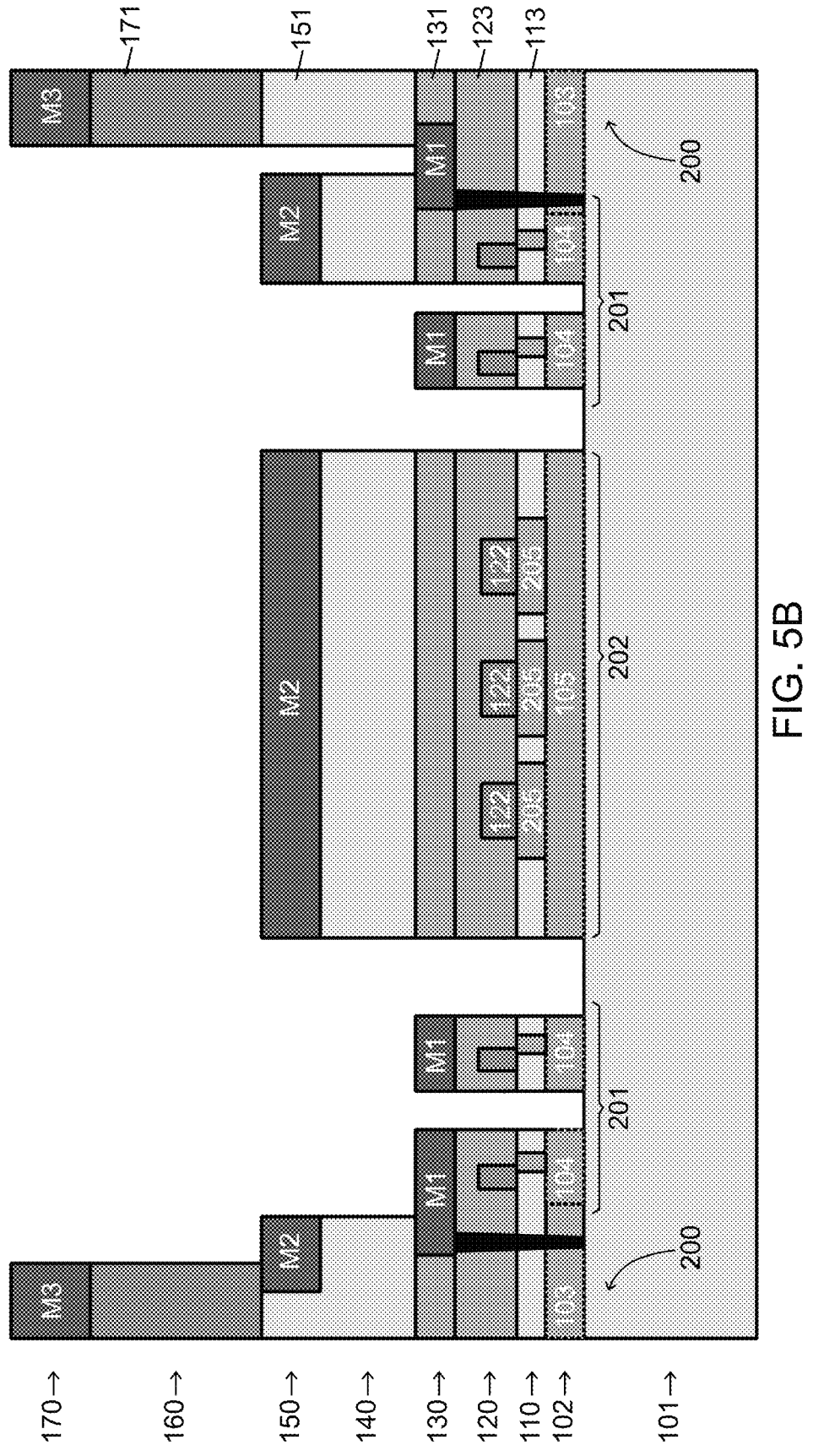
Figure 5C:
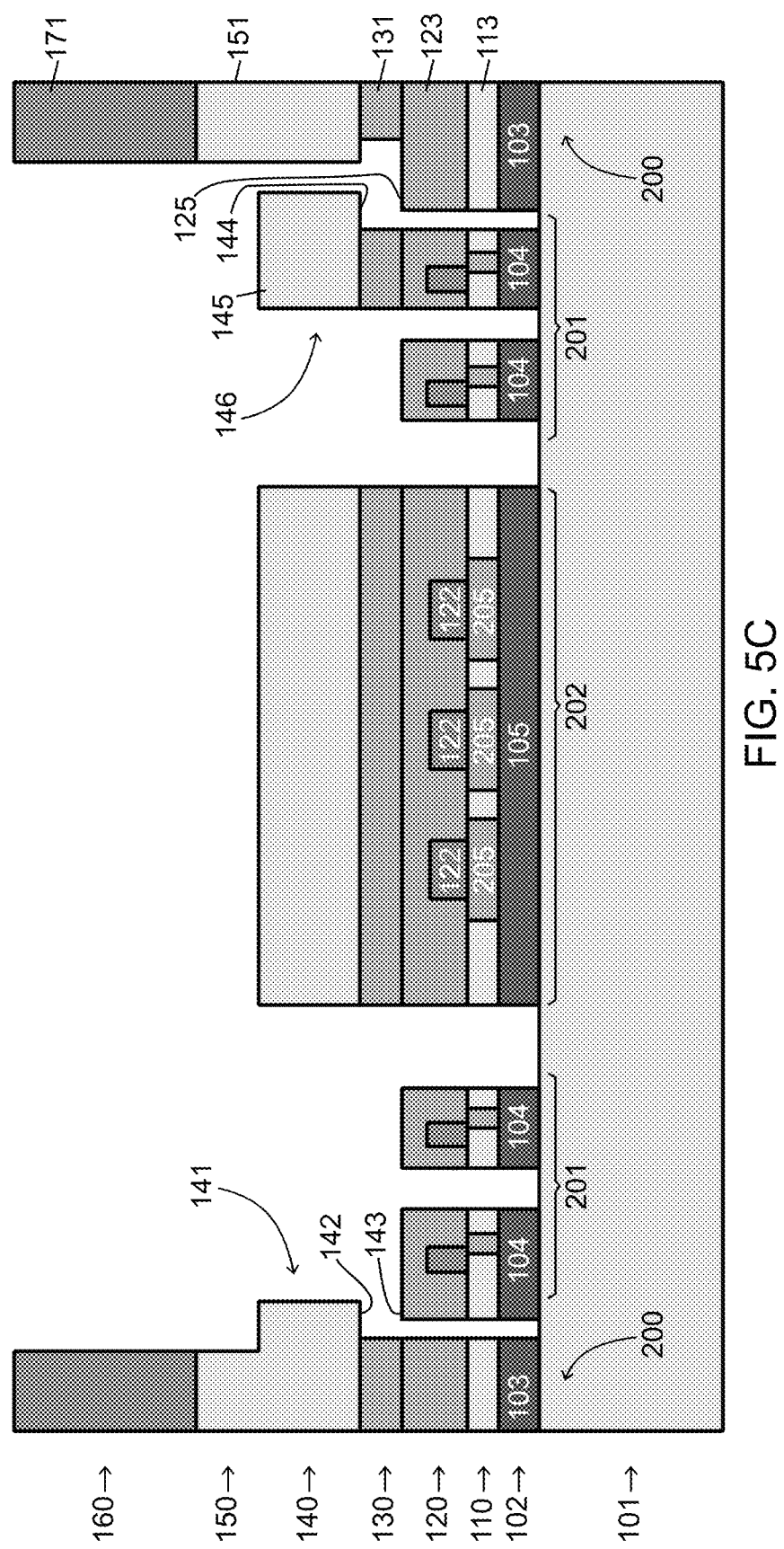
Figure 5D:
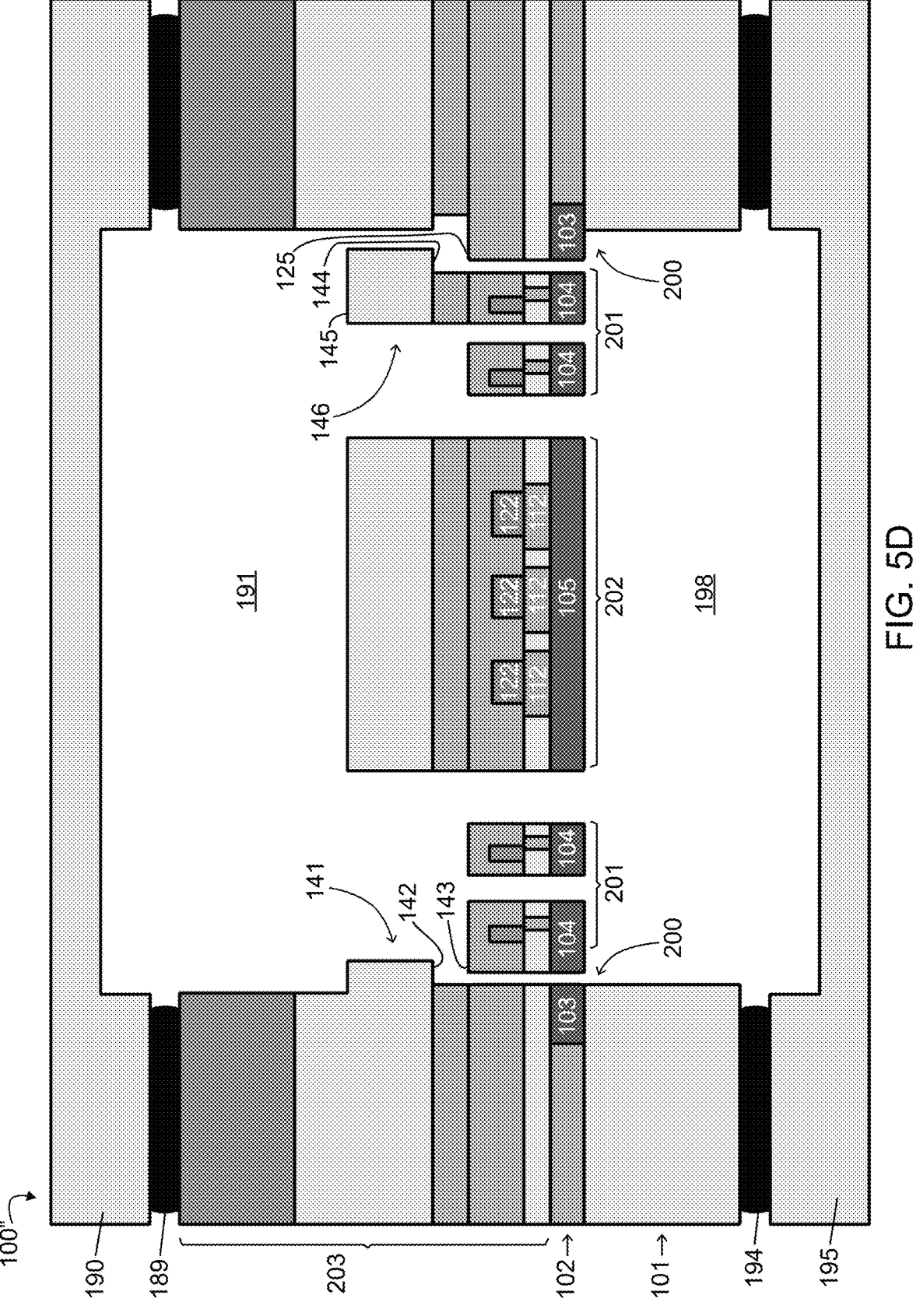

Observe also that the insulating material 151 on right, atop the stopper 146, is aligned on its left with the via 290 as well as the insulator layer 160 such that the stopper 146 does not constrain upward movement. This is so because, as can be seen in FIG. 5A, a via 291 is formed extending from the bottom face of the insulating material 151 to the top face of the first metal layer 130, the left side of this via 291 aligning with the right side of the rightmost metal M2. In FIG. 5B after etching, the material within the via 291 has been removed to thereby form the bottom stopper 146.

Figure 6A:
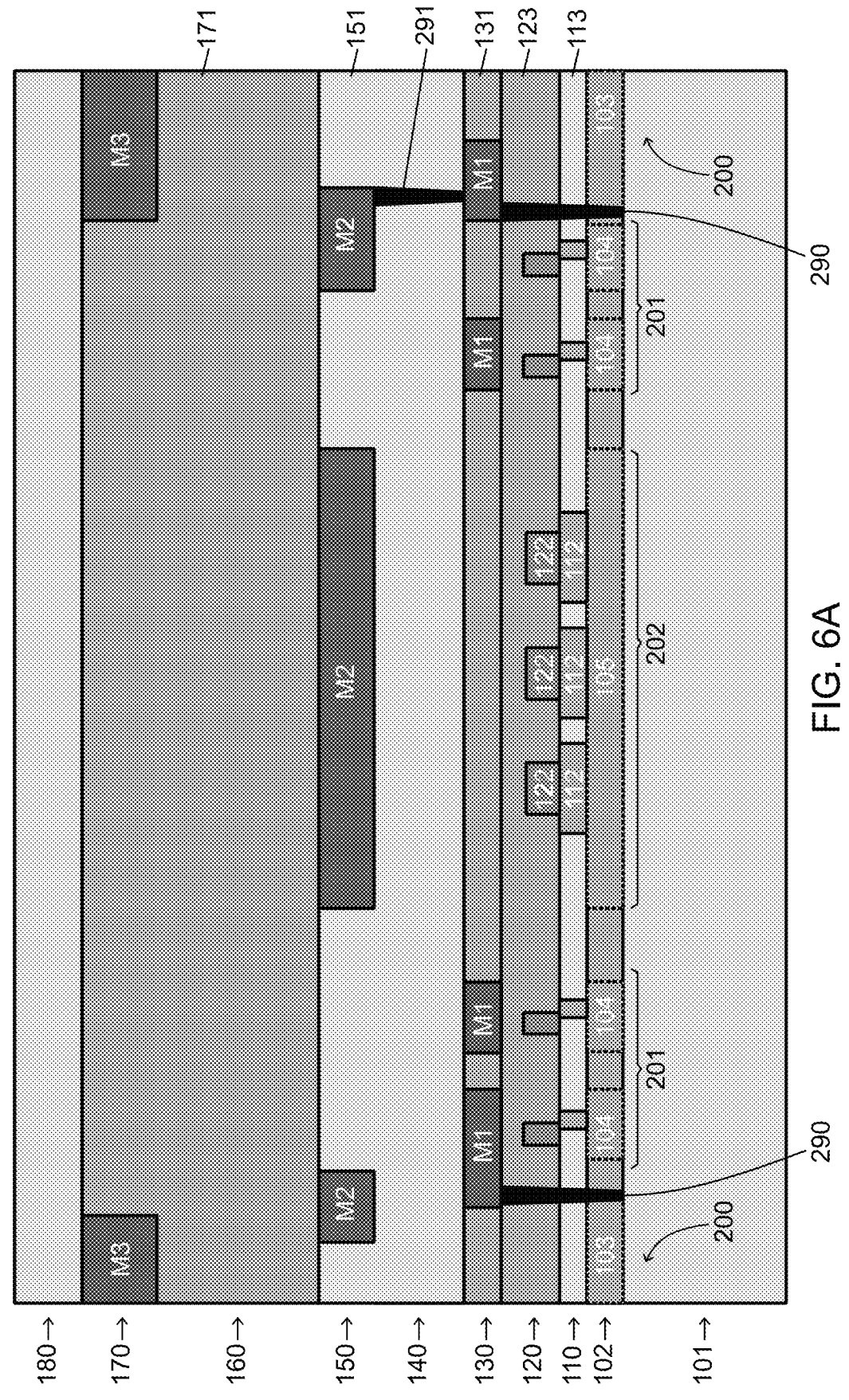
FIGS. 6A-6D are a series of cross-sectional views showing a further process flow for forming a temperature sensing pixel.
Figure 6B:
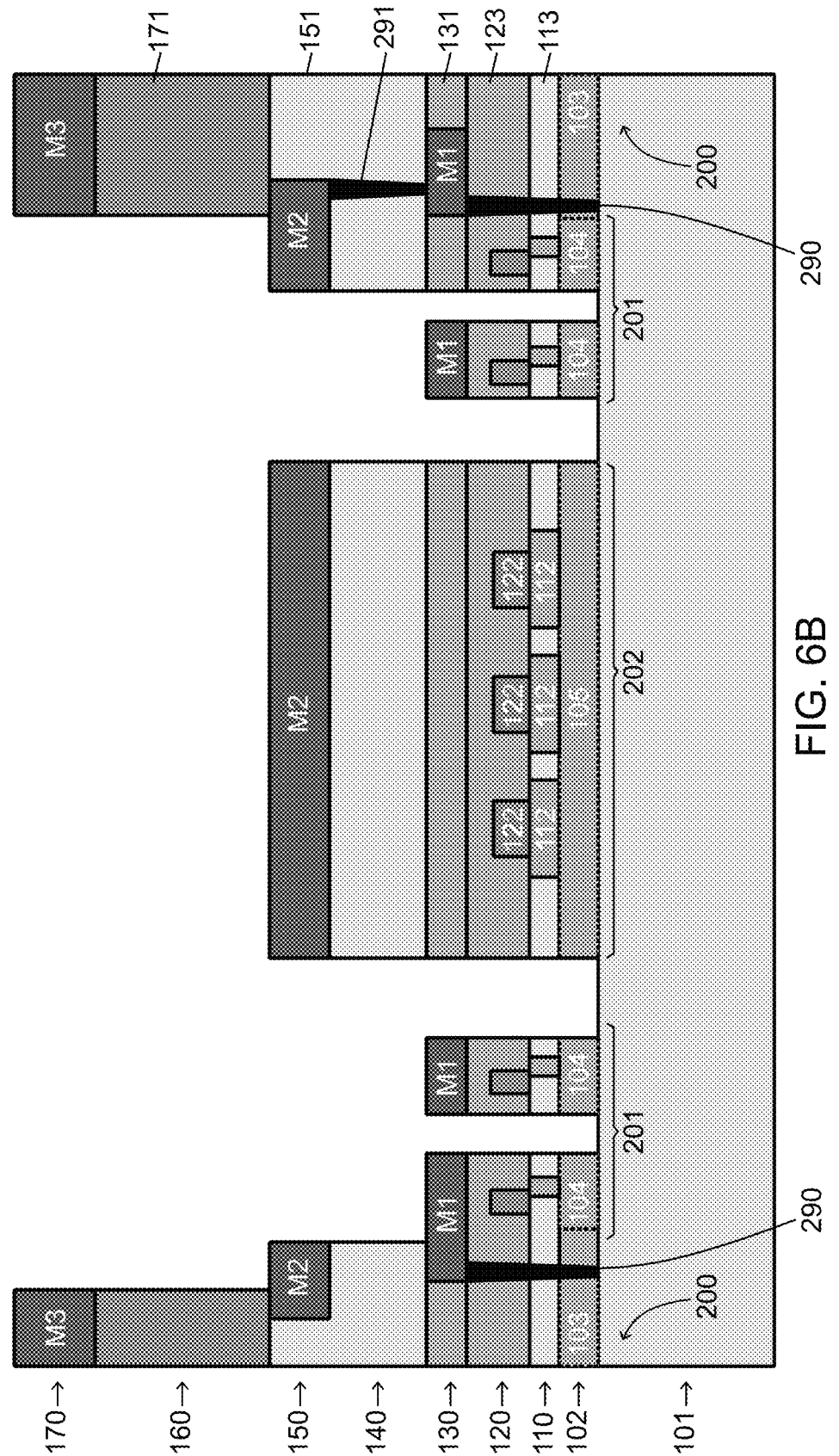
Figure 6C:
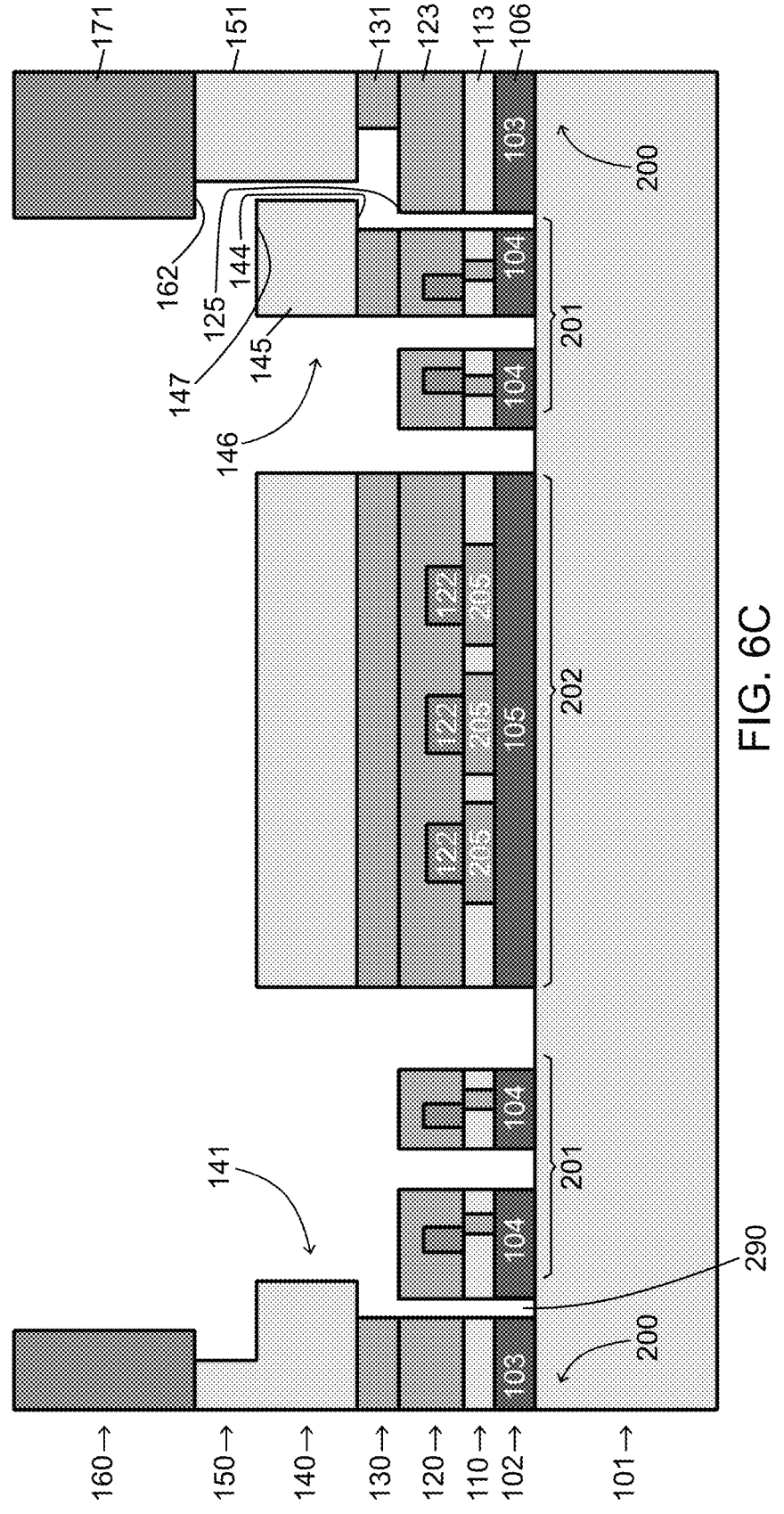
Figure 6D:
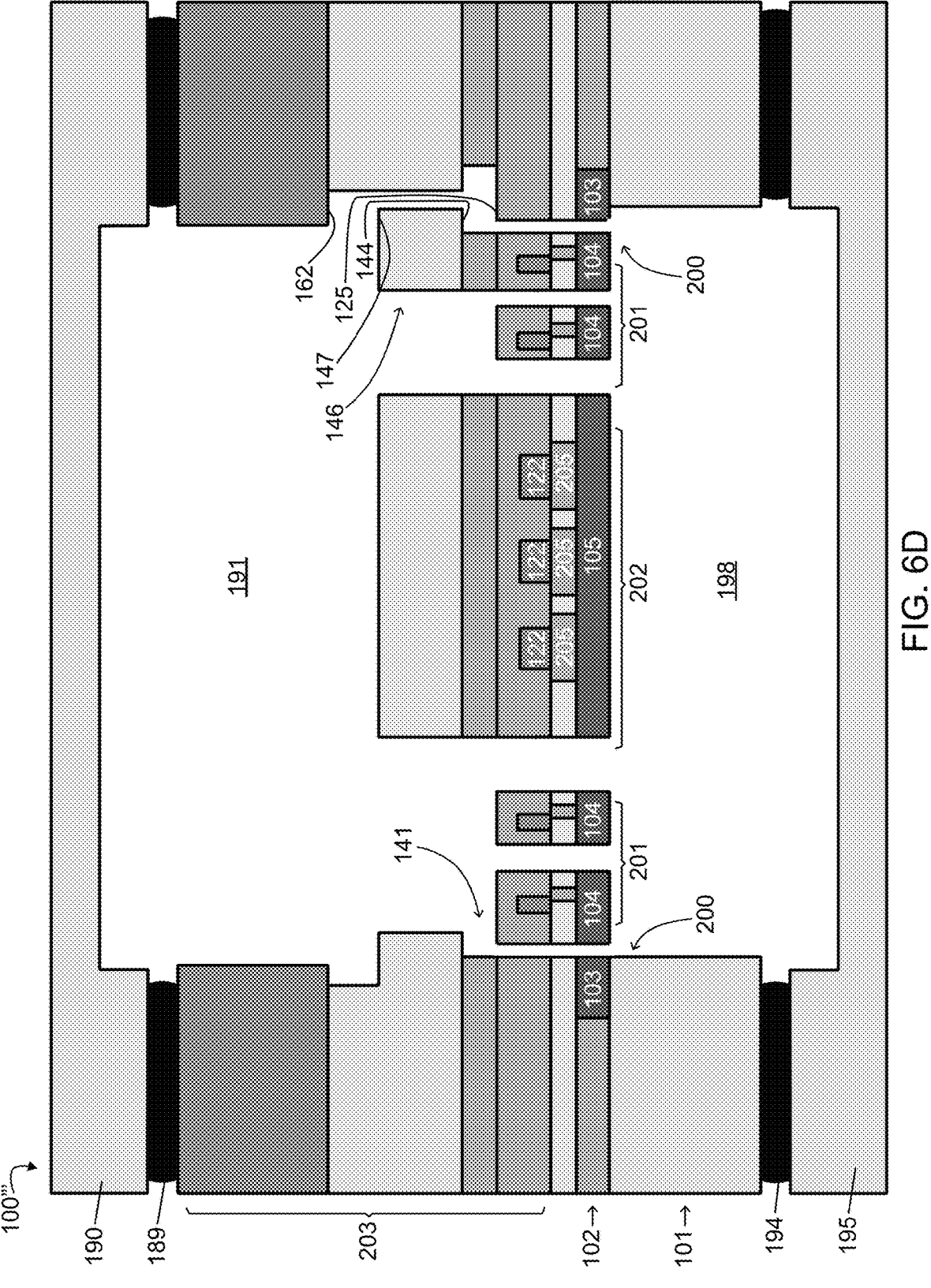

Now described with reference to FIGS. 6A-6C is an example in which the stopper 146 constrains both upward and downward movement of the springs 201.

The difference in the process flow here as opposed to the process flow of FIGS. 5A-5B is that the right side of the via 291 aligns with the right side of the rightmost metal M2. As a result of this, the insulating material 151 on the right, atop the stopper 146, is aligned with the right side of the via 191 but is lesser in width than the remaining portion of the insulator layer 160 on the right to expose the bottom face 162 of the remaining portion of the right-side insulator 160. The bottom face 162 of the remaining portion of the right-side insulator acts as an upper stopper to constrain upward movement of the right-side spring 201 when the top surface 147 of the stopper 146 contacts it. Also here, downward movement of the right-side spring 201 results in the bottom surface of the stopper 146 making contact with the exposed top surface 125 of the insulator layer, stopping the downward movement of the right-side spring 201 and in turn constraining the downward movement of the mass 202

As will be appreciated by those of skill in the art, the thermal sensing pixels 100 described above may be formed at the wafer level into arrays of such thermal sensing pixels, and multiple such arrays may be used to form a single device.

Figures 7, 8:
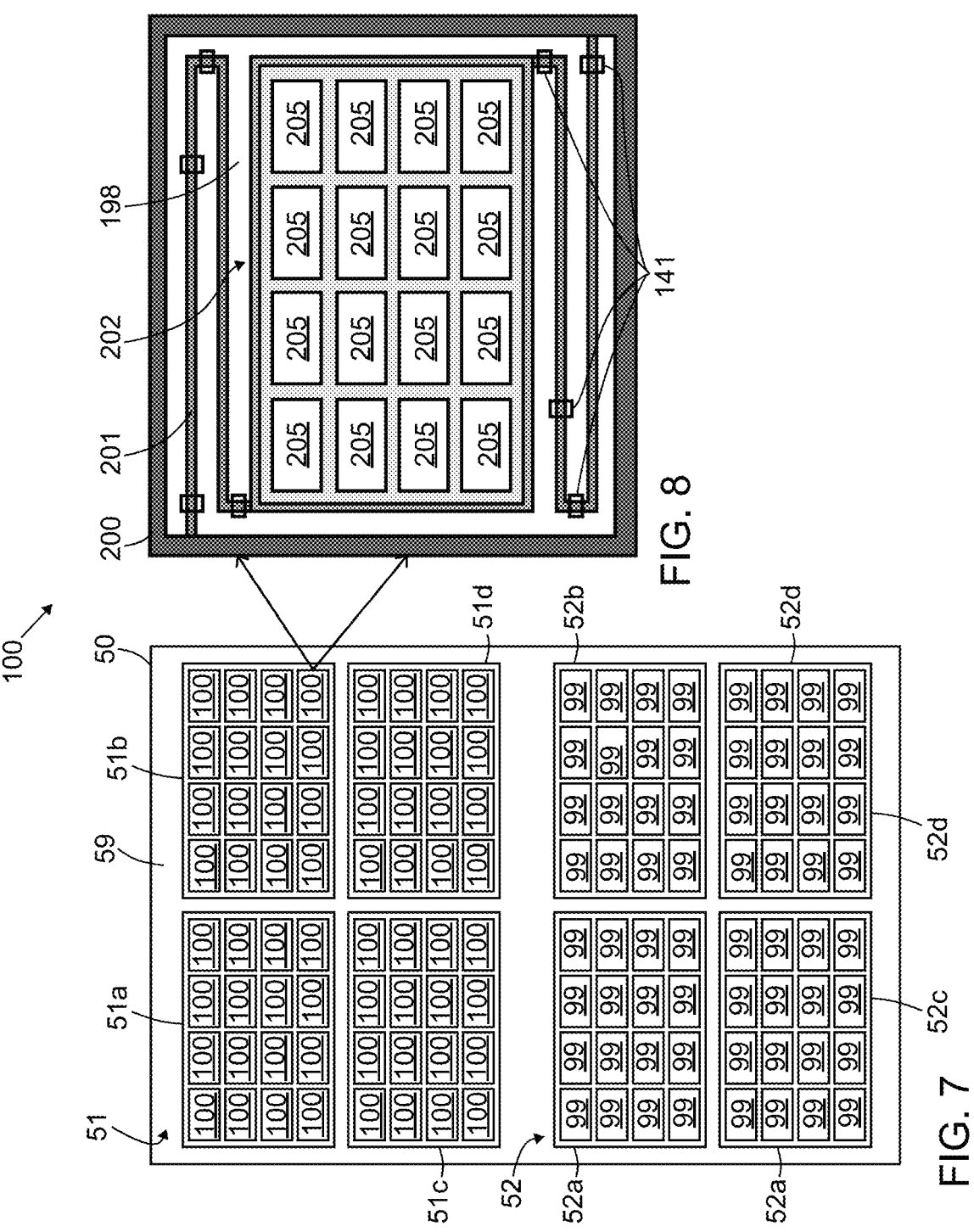
FIG. 7 is a diagrammatical view of a thermal sensing device including a sensing array of the thermal sensors disclosed herein as well as a reference array of the thermal sensors disclosed herein.
FIG. 8 is a greatly enlarged top view of one of the individual thermal sensing pixels of the sensing array of FIG. 7.

See, for example, FIG. 7, showing a single sensing device 50 with a first array 51 of thermal sensing pixels 100 as described above and a second array 52 of reference pixels 99 that are covered by material that is not transparent to infrared sensing. Therefore, the array 51 of thermal sensing pixels 100 is used to sense ambient temperature within the device 50 in addition to the temperature/wavelength of incoming infrared radiation while the array 52 of reference pixels 99 is used to sense ambient temperature within the device 50. The difference between the ambient+incoming temperature sensed by the array 51 and the ambient temperature sensed by the array 52 yields the temperature to be sensed.

As to specific structure, the first array 51 includes four sub-arrays 51a-51d carried by a device frame 59. Wide portions of the device frame 59 space the sub-arrays 51a-51d apart from one another. Each sub-array 51a-51d itself includes an array of thermal sensing pixels 100, the thermal sensing pixels 100 being those described above and each including a frame 200, a mass 202 containing an array of TMOS transistors 205, and springs 201 connected between the frame 200 and mass 202 to suspend the mass 202 over the cavity 198. Within each sub-array 51a-51d, its thermal sensing pixels 100 are separated from one another by narrow frame portions.

The second array 52 includes four sub-arrays 52a-52d carried by a device frame 59. Wide portions of the device frame 59 space the sub-arrays 52a-52d apart from one another. Each sub-array 52a-52d itself includes an array of reference pixels 99, such as those described above.

Observe that the stoppers 141 of each pixel 100 or reference pixel 99 may be located at any point along the associated springs 201.

Finally, it is clear that modifications and variations may be made to what has been described and illustrated herein, without thereby departing from the scope of this disclosure. For example, the use of one or more metal layers as etch stops can be used in any suitable process to create a device having an integrated circuit suspended in a cavity across a solid frame by springs made from an intermetal dielectric layer, the use of the metal layers as etch stops providing for the creation for upper and/or lower stoppers to constrain the upward and/or downward movement of the springs and this the integrated circuit.

Figure 9A:
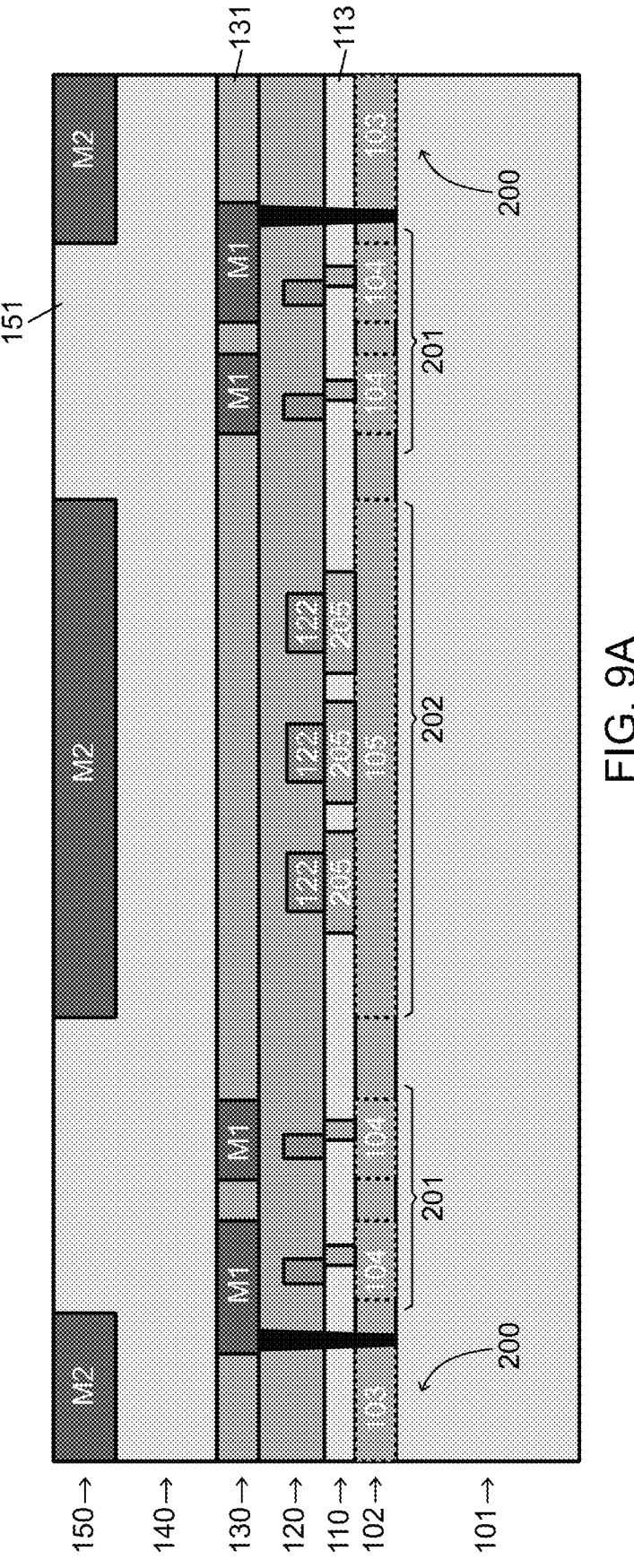
FIGS. 9A-9D are a series of cross-sectional views showing another alternative process flow for forming a temperature sensing pixel.
Figure 9B:
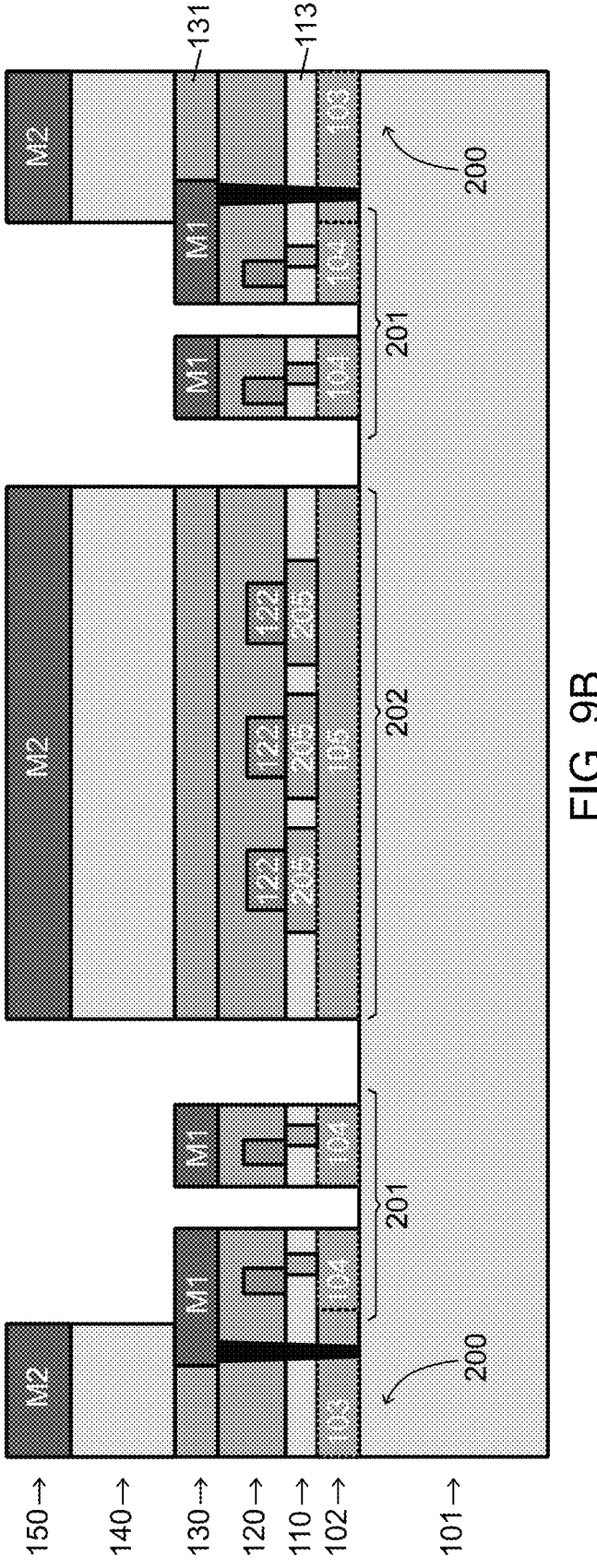
Figure 9C:
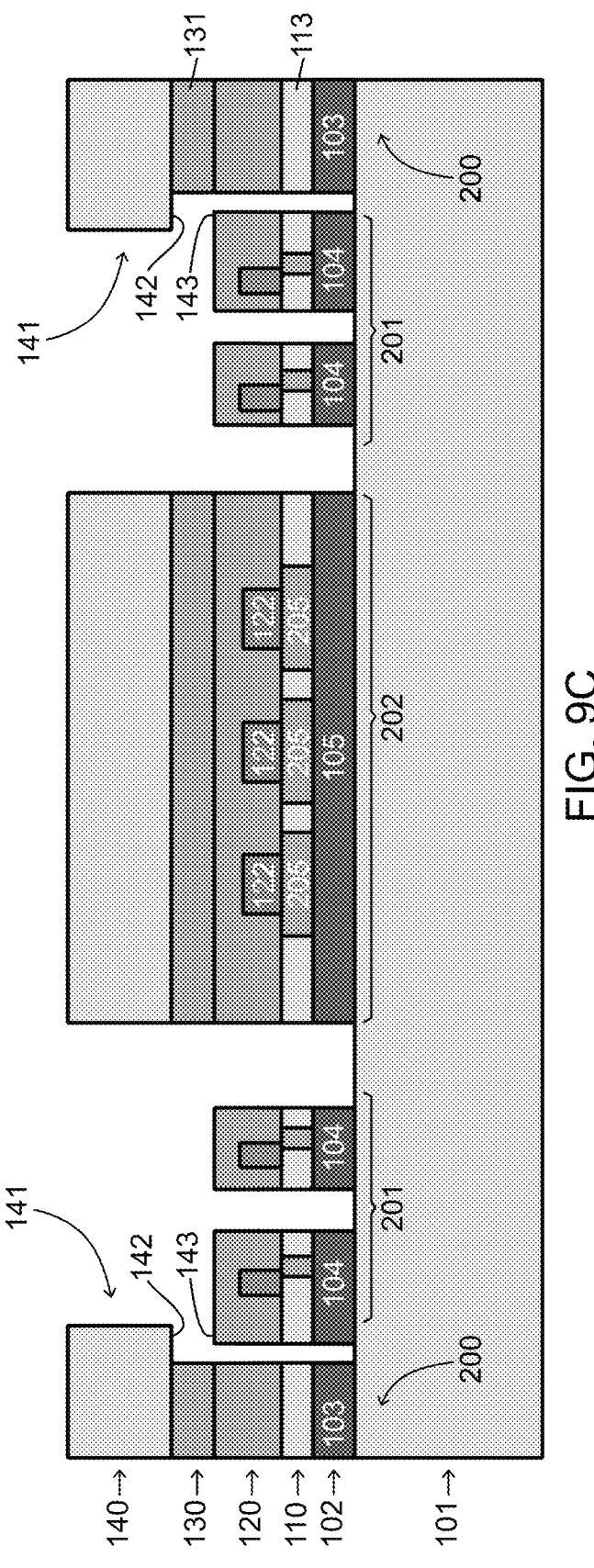
Figure 9D:
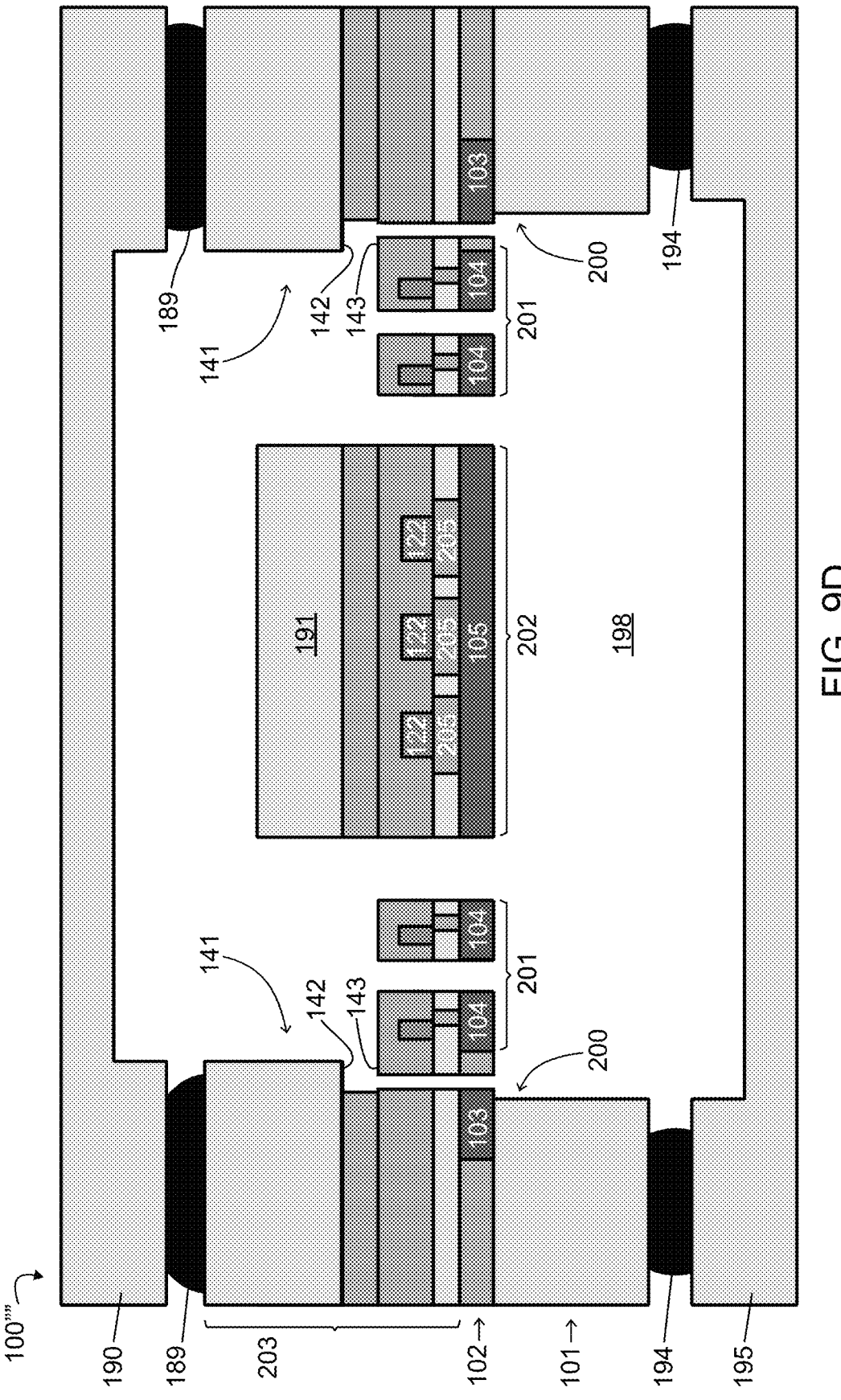

As an example alternative process flow, now described with reference to FIGS. 9A-9D is an example in which the third metal layer 170 is not present, and in which the metal M2 has portions extending from a leftmost side (referring to FIGS. 9A-9C) of the pixel 100"" to partially overlie and overlap the leftmost metal M1, portions extending across to completely overlie the mass 105, and portions extending from the rightmost side (referring to FIGS. 9A-9C) of the pixel 100"" to partially overlie and overlap the rightmost metal M1. As can be observed, when the etch is performed to remove the metal portions M2, this forms the upper stoppers 141, as shown in FIGS. 9C-9D. Thus here, due to the lack of the third metal layer 170, the top cap 190 is bonded to the top of sidewalls 203, said sidewalls being formed by the layer stack of 110, 120, 130, 140, and 150.

Figure 10A:
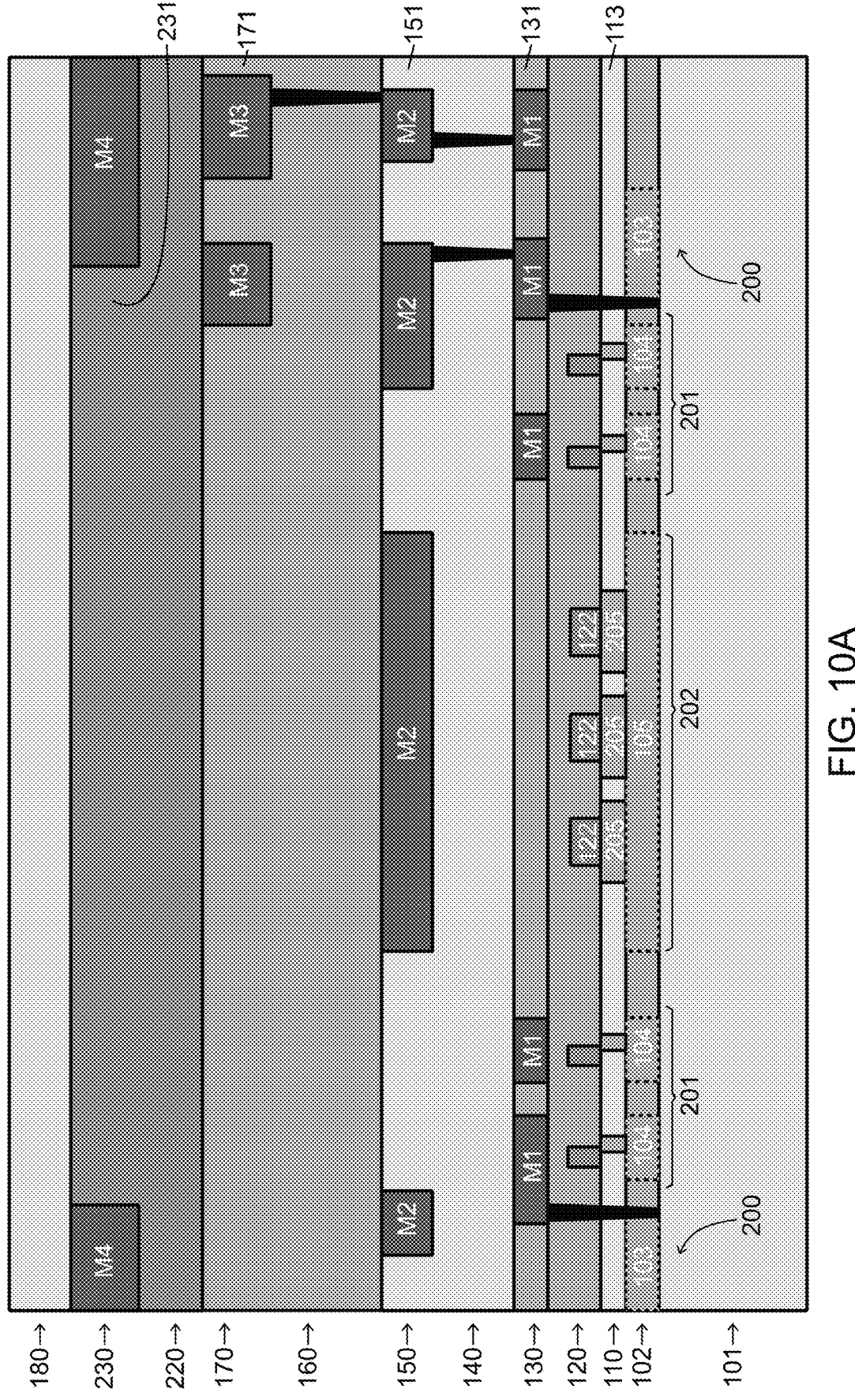
FIGS. 10A-10D are a series of cross-sectional views showing yet another further process flow for forming a temperature sensing pixel.

Another process flow in which four metal levels 130, 150, 170, and 220 are utilized is now described with reference to FIGS. 10A-10D. The general process flow is the same as described above in detail with respect to FIGS. 3A-3I. As shown in FIG. 10A, in the third metal layer 170, the patterned metal M3 overlies the right-side patterned metal M2 in the second metal layer 150, but no patterned metal M3 overlies the left-side patterned metal M2 in the second metal layer 150. As also shown, an insulator layer 220 is formed atop the dielectric 160, a fourth metal layer 230 is formed within the insulator layer 220, and insulator layer 180 is formed atop the insulator layer 230. The fourth metal layer 230 is formed through the formation of metal M3 within the insulating material 231 of the insulator layer 220. Observe the locations of the patterned metal M4 partially overlying the left-side metal M2 within the second metal layer 150, partially overlying the right-side metal M3 within the third metal layer 230, and fully overlying the rightmost right-side metal M3 within the third metal layer 230.

Figure 10B:
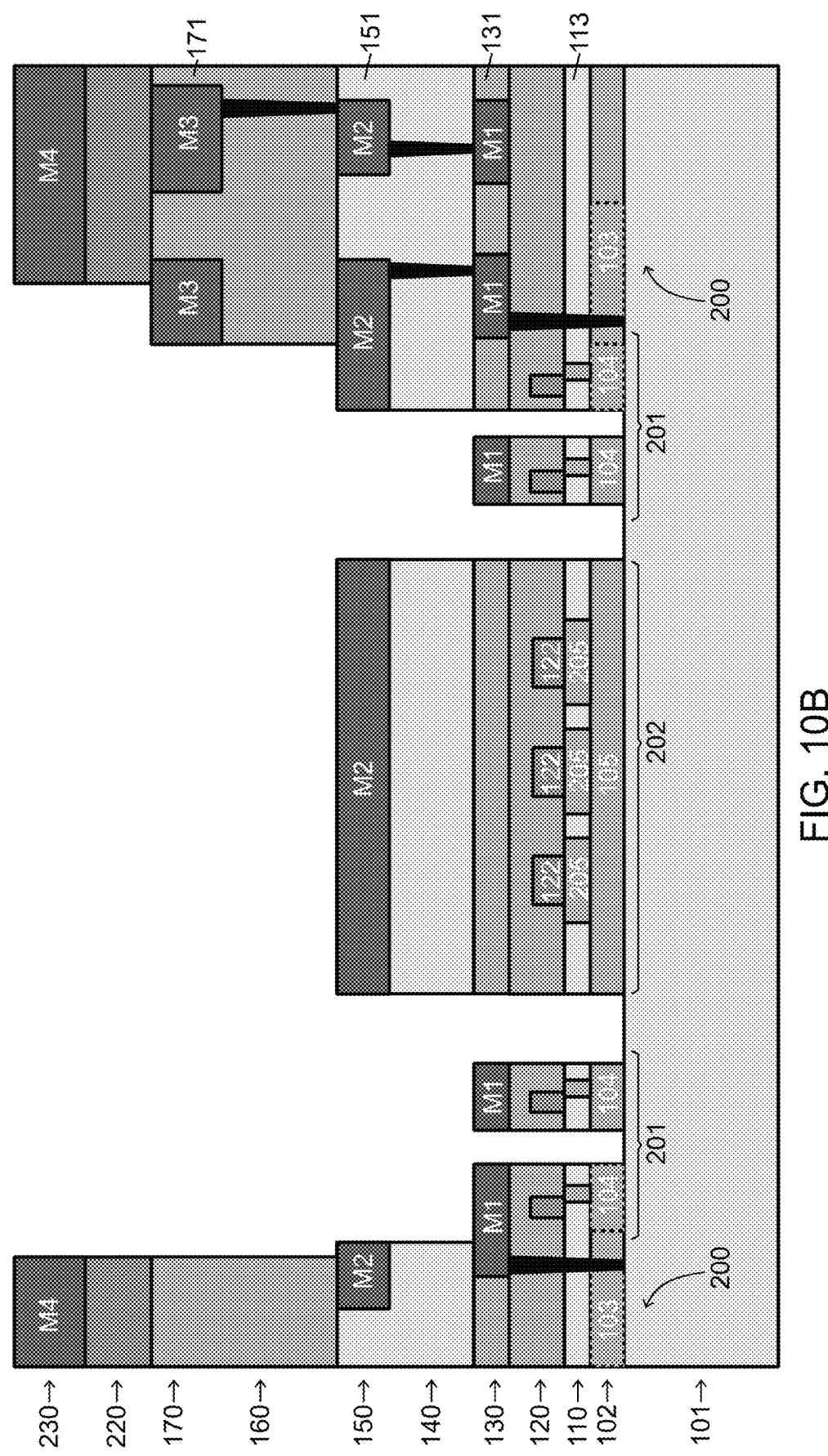
Figure 10C:
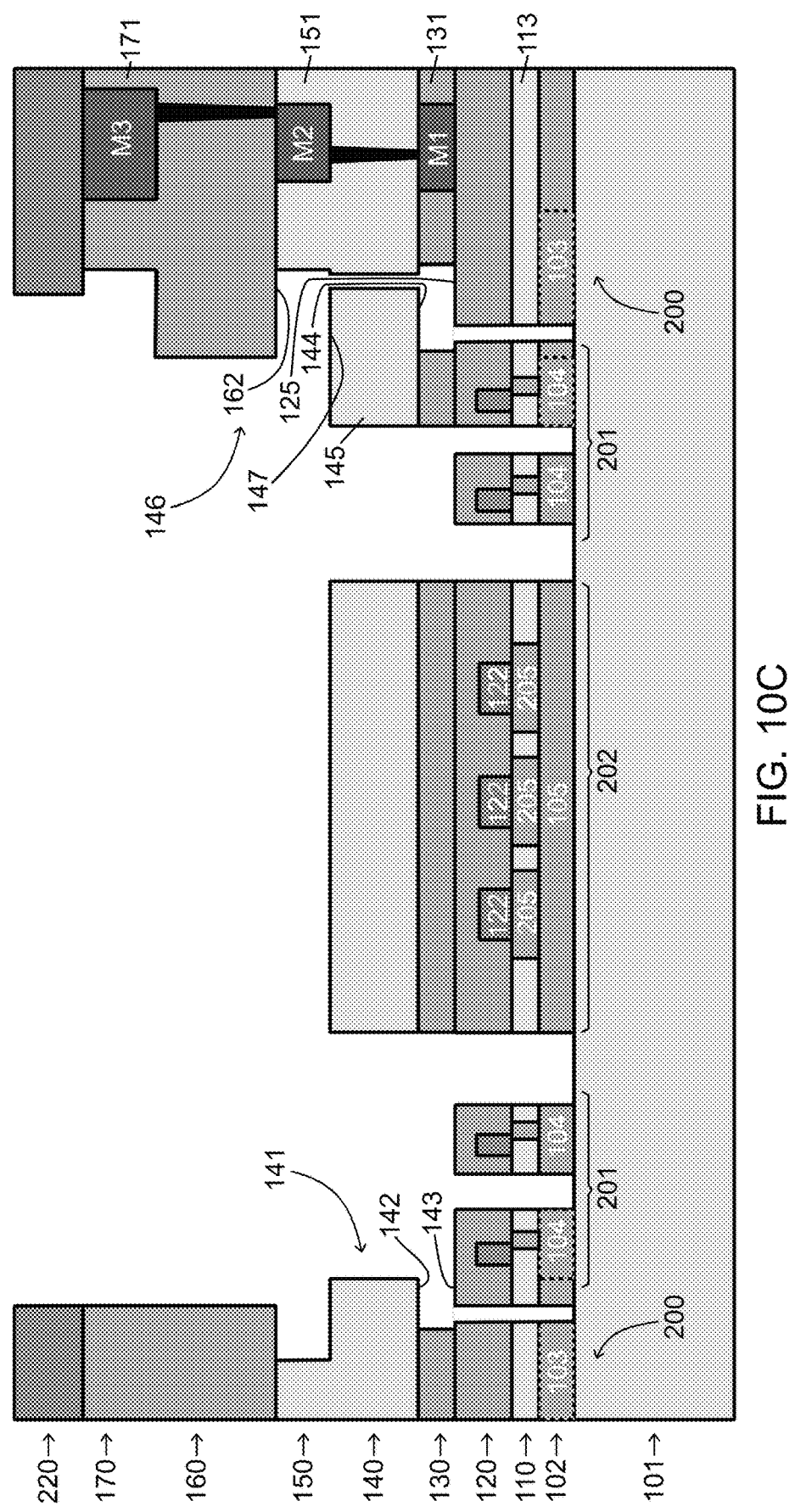
Figure 10D:
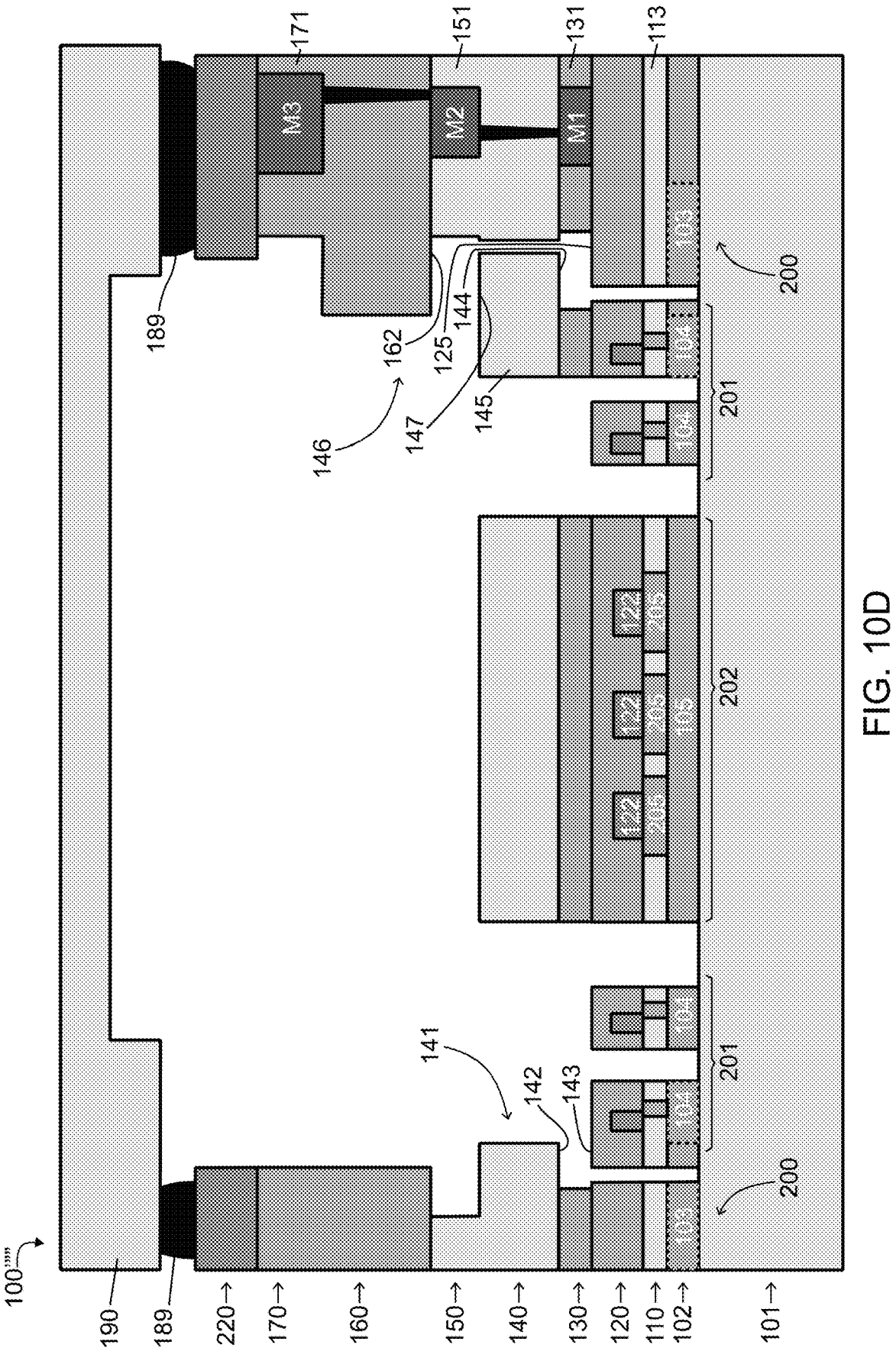

The results of the anisotropic blind etch that is selective as to the insulative materials within the layers 130, 140, 160, 220, and 180 are shown in FIG. 10B, and the results of the isotropic etch that is selective as to the material used to form the metal M4, M3, M2, and M1 as well as the vias are shown in FIG. 10C. In the final device 100"" as shown in FIG. 10D, the stopper 146 created here served to limit both upward and downward movement of the right-side spring 201, while the stopper 141 serves to limit upward movement of the left-side spring 201.

Also understand that the teachings of the different embodiments contained hereinabove may be combined with one another in different combinations and ways in which they have been shown and described.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method of forming a thermal sensing pixel, comprising:

providing a base substrate having a buried oxide layer thereon, with a silicon layer being on the buried oxide layer, whereby the buried oxide layer and silicon layer are selectively etchable to form a frame structure, spring structures, and a central structure;

forming an active layer within the silicon layer to include at least one integrated circuit therein, the at least one integrated circuit formed in a position overlying the central structure;

forming a first insulator layer on the active layer;

forming a first metal layer in the first insulator layer, with metallized portions of the first metal layer overlying the spring structures;

forming a second insulator layer on the first metal layer;

forming a second metal layer in second insulator layer, and with a central metallized portion of the second metal layer overlying the at least one integrated circuit and central structure;

forming a third insulator layer on the second metal layer;

forming a third metal layer in the third insulator layer;

performing an etch to remove the third insulator layer, portions of the second insulator layer except those underlying metallized portions of the third metal layer, and portions of the first insulator layer except those underlying metallized portions of the third metal layer and second metal layer, as well as portions of the silicon layer and buried oxide layer underlying metallized portions of the third metal layer, second metal layer, and first metal layer to thereby form the frame structure, spring structures, and central structure; and removing the metallized portions of the third metal layer, second metal layer, and first metal layer to thereby form a frame defined by the frame structure, springs defined by the spring structures, and a mass defined by the central structure, with a first stopper being defined by exposed portions of a bottom surface of the second insulator layer.

2. The method of claim 1, wherein the second metal layer is also formed to include peripheral metallized portions overlying certain metallized portions of the first metal layer; wherein the metallized portions of the third metal layer overlay peripheral metallized portions of the second metal layer but not the metallized portions of the first metal layer; wherein metallized portions of the third metal layer overlay the peripheral metallized portions of the second metal layer; wherein the etch also fails to remove the peripheral metallized portions of the second metal layer; and wherein the first stopper constrains movement of the spring in a first direction.

3. The method of claim 2, wherein a thickness of the first stopper is defined by a distance between the second metal layer and the first metal layer.

4. The method of claim 1, wherein metallized portions of the third metal layer overlay the metallized portions of the first metal layer.

5. The method of claim 4, wherein a thickness of the first stopper is defined by a distance between the third metal layer and the first metal layer.

6. The method of claim 1, wherein the second metal layer is also formed to include peripheral metallized portions overlying certain metallized portions of the first metal layer; further comprising, prior to formation of the first metal layer, forming first vias extending through the first insulator layer, silicon layer, and buried oxide layer to reach the base substrate;

wherein the metallized portions of the first metal layer are formed to overlay the first vias;

further comprising forming a second via through the second insulator layer to reach a top surface of a metallized portion of the first metal layer;

wherein removal of the metallized portions of the first metal layer also removes material forming the first vias;

wherein removal of the peripheral metallized portions of the second metal layer also removes material forming the second via;

wherein removal of the material forming the first vias and the second via defines a pillar extending upwardly from the first insulator layer, with a second stopper being defined by exposed portions of a bottom surface of the second insulator forming the pillar; and wherein the second stopper constrains movement of the spring.

7. The method of claim 6, wherein the metallized portions of the third metal layer overlay at least one of the peripheral metallized portions of the second metal layer so that removal of the peripheral metallized portions of the second metal layer defines a third stopper formed by exposed portions of a bottom of the third insulator layer.

8. The method of claim 7, further comprising: forming a fourth insulator layer on the third metal layer; and forming a fourth metal layer on the fourth metal layer;

wherein the etch also removes the fourth insulator layer except portions thereof underlying metallized portions of the fourth metal layer; and wherein the metallized portions of the fourth metal layer are also removed.

9. The method of claim 1, further comprising affixing a top cap over the third insulator layer after the removal of the metallized portions of the third metal layer, second metal layer, and first metal layer.

10. The method of claim 1, wherein the at least one integrated circuit comprises at least one thermally isolated MOS (TMOS) sensor.

11. The method of claim 1, further comprising: forming a fourth insulator layer on the third metal layer; and forming a fourth metal layer on the fourth metal layer;

wherein the etch also removes the fourth insulator layer except portions thereof underlying metallized portions of the fourth metal layer; and wherein the metallized portions of the fourth metal layer are also removed.

12. A method of forming a thermal sensing pixel, comprising:

providing a base substrate having a buried oxide layer thereon, with a silicon layer being on the buried oxide layer, whereby the buried oxide layer and silicon layer are selectively etchable to form a frame structure, spring structures, and a central structure;

forming an active layer within the silicon layer to include at least one integrated circuit therein, the at least one integrated circuit formed in a position overlying the central structure;

forming a first insulator layer on the active layer;

forming a first metal layer in the first insulator layer, with metallized portions of the first metal layer overlying the spring structures;

forming a second insulator layer on the first metal layer;

forming a second metal layer in second insulator layer, and with a central metallized portion of the second metal layer overlying the at least one integrated circuit and central structure;

performing an etch to remove portions of the second insulator layer except those underlying metallized portions of the first insulator layer except those underlying metallized portions of the second metal layer, as well as portions of the silicon layer and buried oxide layer underlying metallized portions of the second metal layer and first metal layer to thereby form the frame structure, spring structures, and central structure; and removing the metallized portions of the second metal layer and first metal layer to thereby form a frame defined by the frame structure, springs defined by the spring structures, and a mass defined by the central structure, with a first stopper being defined by exposed portions of a bottom surface of the second insulator layer.

13. The method of claim 12, wherein the second metal layer is also formed to include peripheral metallized portions overlying certain metallized portions of the first metal layer; wherein the etch also fails to remove peripheral metallized portions of the second metal layer and wherein the first stopper constrains movement of the spring in a first direction.

14. The method of claim 13, wherein the second metal layer is also formed to include peripheral metallized portions overlying certain metallized portions of the first metal layer; further comprising, prior to formation of the first metal layer, forming first vias extending through the first insulator layer, silicon layer, and buried oxide layer to reach the base substrate;

wherein the metallized portions of the first metal layer are formed to overlay the first vias;

further comprising forming a second via through the second insulator layer to reach a top surface of a metallized portion of the first metal layer;

wherein removal of the metallized portions of the first metal layer also removes material forming the first vias;

wherein removal of the peripheral metallized portions of the second metal layer also removes material forming the second via;

wherein removal of the material forming the first vias and the second via defines a pillar extending upwardly from the first insulator layer, with a second stopper being defined by exposed portions of a bottom surface of the second insulator layer forming the pillar; and wherein the second stopper constrains movement of the spring in a second direction opposite to the first direction.

15. The method of claim 12, further comprising affixing a top cap over the second insulator layer after the removal of the metallized portions of the second metal layer and first metal layer.

16. The method of claim 12, wherein the at least one integrated circuit comprises at least one thermally isolated MOS (TMOS) sensor.

\* \* \* \* \*